US009721631B2

(12) United States Patent
Kent et al.

(10) Patent No.: US 9,721,631 B2
(45) Date of Patent: *Aug. 1, 2017

(54) PRECESSIONAL MAGNETIZATION REVERSAL IN A MAGNETIC TUNNEL JUNCTION WITH A PERPENDICULAR POLARIZER

(71) Applicant: New York University, New York, NY (US)

(72) Inventors: Andrew Kent, New York, NY (US); Huanlong Liu, New York, NY (US)

(73) Assignee: NEW YORK UNIVERSITY, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/775,442

(22) PCT Filed: Mar. 14, 2014

(86) PCT No.: PCT/US2014/028917
§ 371 (c)(1),
(2) Date: Sep. 11, 2015

(87) PCT Pub. No.: WO2014/153064
PCT Pub. Date: Sep. 25, 2014

(65) Prior Publication Data
US 2016/0035401 A1 Feb. 4, 2016

Related U.S. Application Data

(60) Provisional application No. 61/785,453, filed on Mar. 14, 2013.

(51) Int. Cl.
G11C 11/14 (2006.01)
G11C 11/16 (2006.01)
H01L 43/08 (2006.01)

(52) U.S. Cl.
CPC .......... *G11C 11/161* (2013.01); *G11C 11/165* (2013.01); *H01L 43/08* (2013.01)

(58) Field of Classification Search
CPC ................. G11C 11/161; G11C 11/165; H01L 43/08365/55, 131, 130, 158, 171
See application file for complete search history.

(56) References Cited

U.S. PATENT DOCUMENTS 8,755,222 B2 * 6/2014 Kent .................. G11C 11/16
365/130
2005/0258829 A1 11/2005 Bieri et al.

FOREIGN PATENT DOCUMENTS

WO WO-2012/068309 5/2012

OTHER PUBLICATIONS

International Search Report and Written Opinion for Application No. PCT/US2014/028917, Mailed Aug. 7, 2014, 7 pages.

* cited by examiner

*Primary Examiner* — Fernando Hidalgo
(74) *Attorney, Agent, or Firm* — Foley & Lardner LLP

(57) ABSTRACT

A magnetic device that includes a perpendicular magnetized polarizing layer configured to provide a first spin-torque and an in-plane magnetized free layer having a magnetization vector having at least a first stable state and a second stable state. The magnetic device also includes a reference layer configured to provide a second spin-torque. The first spin-torque and the second spin-torque can combine. The in-plane magnetized free layer and the reference layer form a magnetic tunnel junction and the combined first spin-torque and second spin-torque influences the magnetic state of the in-plane magnetized free layer. An application of a voltage pulse, having either positive or negative polarity and a selected amplitude and duration, through the magnetic device causes the magnetization vector to oscillate between the first stable state and the second stable state for a portion of the duration regardless of an initial state of the magnetization vector.

20 Claims, 22 Drawing Sheets

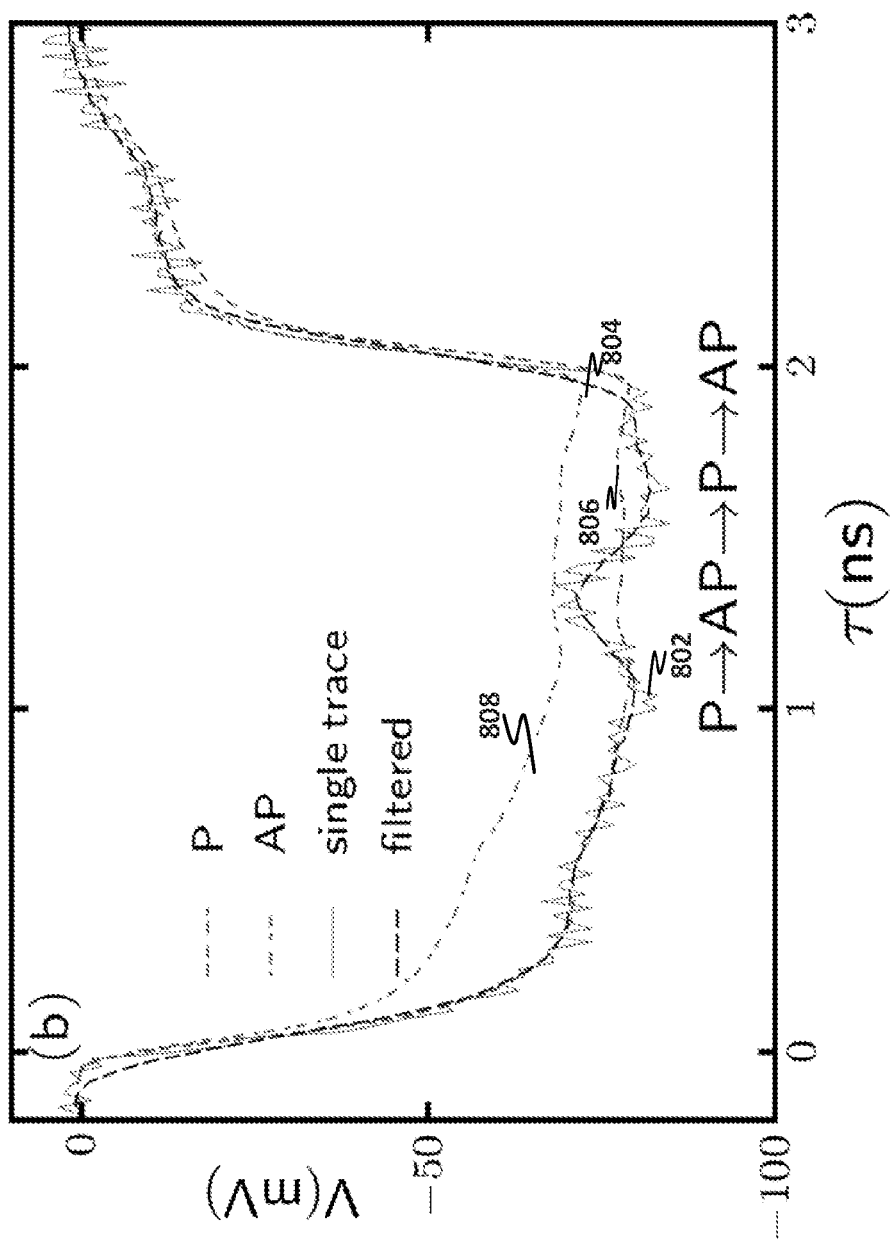

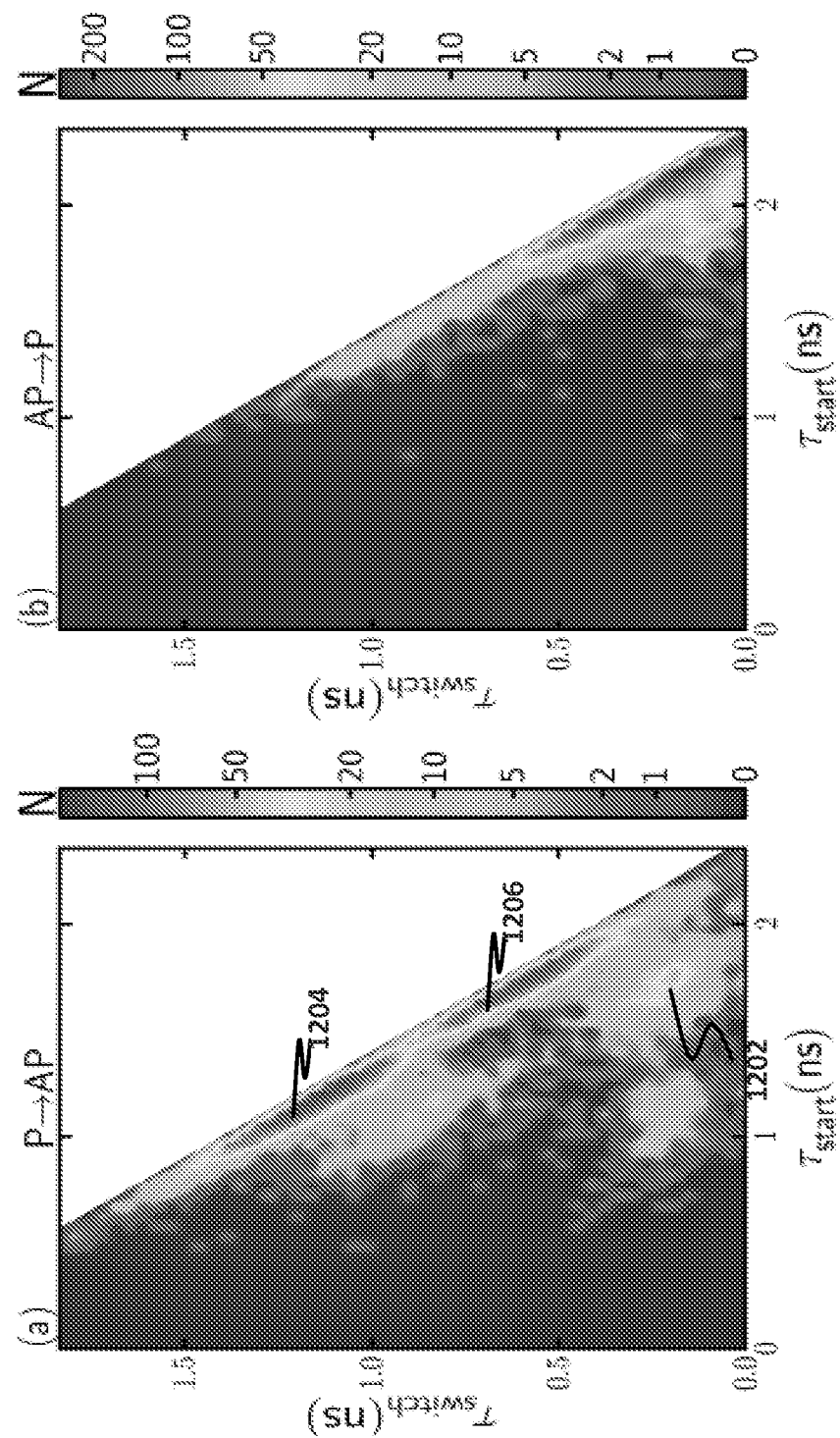

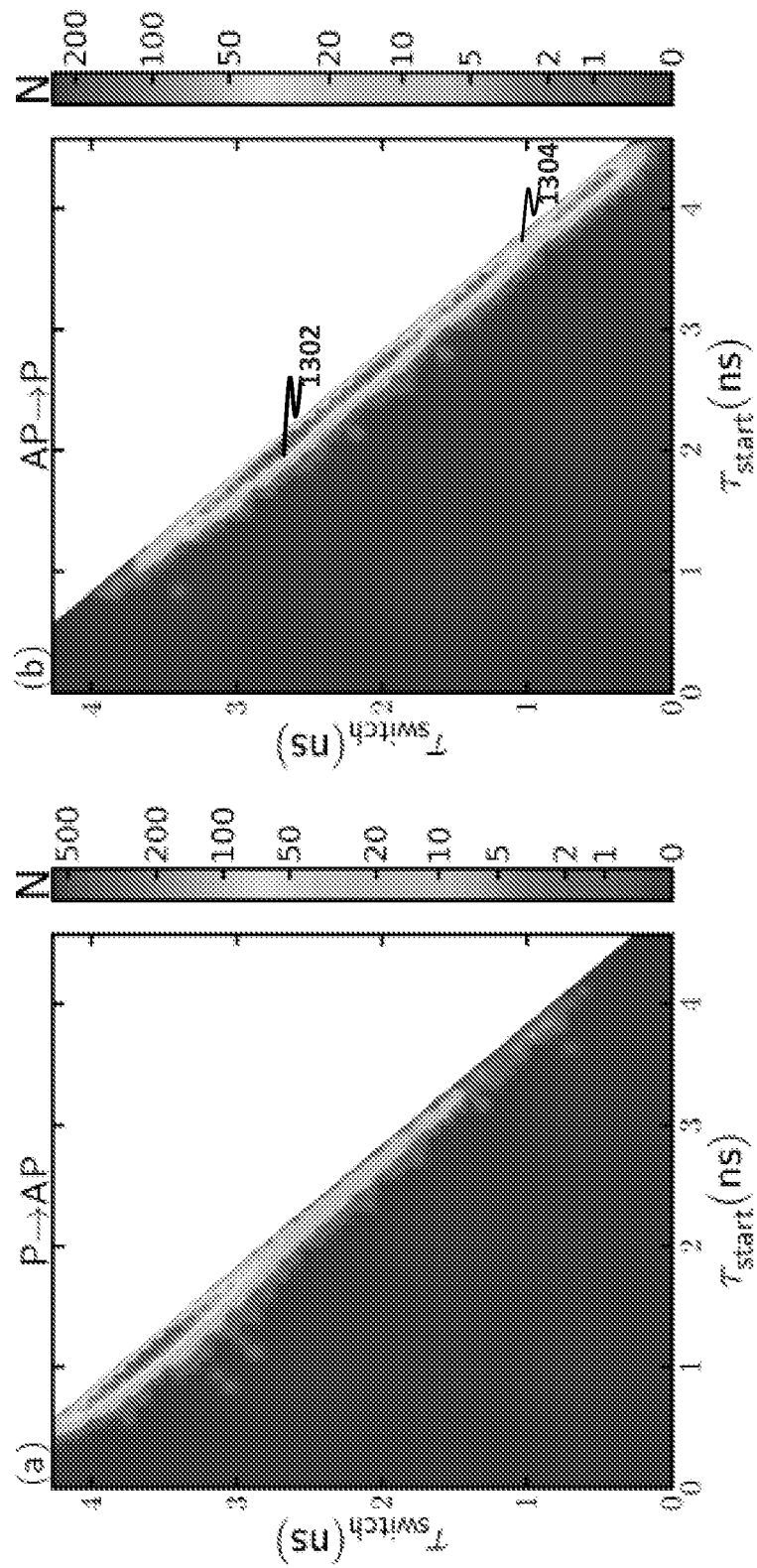

PRECESSIONAL MAGNETIZATION REVERSAL IN A MAGNETIC TUNNEL JUNCTION WITH A PERPENDICULAR POLARIZER

CROSS-REFERENCE TO RELATED PATENT APPLICATIONS

This application is a National Stage of International Application No. PCT/US2014/028917, filed Mar. 14, 2014, which claims priority to U.S. Provisional Application 61/785,453, filed Mar. 14, 2013, which both are incorporated herein by reference in their entirety.

BACKGROUND

One of the reasons for investigation of non-traditional spin-transfer devices structures is to better control the magnetization reversal process. A disadvantage of the traditional collinear magnetized devices is that they often have long mean switching times and broad switching time distributions. This is associated with the face that the STT is non-zero only when the layer magnetizations are misaligned. Spin transfer switching thus requires an initial misalignment of the switchable magnetic (free) layer, e.g. from a thermal fluctuation. Relying on thermal fluctuations leads to incoherent reversal with an unpredictable incubation delay, which can be several nanoseconds.

SUMMARY

In general, one aspect of the subject matter described in this specification can be embodied in a magnetic device that includes a perpendicular magnetized polarizing layer configured to provide a first spin-torque and an in-plane magnetized free layer having a magnetization vector having at least a first stable state and a second stable state. The magnetic device also includes a reference layer configured to provide a second spin-torque. The first spin-torque and the second spin-torque can combine. The in-plane magnetized free layer and the reference layer form a magnetic tunnel junction and the combined first spin-torque and second spin-torque influences the magnetic state of the in-plane magnetized free layer. An application of a voltage pulse, having either positive or negative polarity and a selected amplitude and duration, through the magnetic device causes the magnetization vector to oscillate between the first stable state and the second stable state for a portion of the duration regardless of an initial state of the magnetization vector. Other implementations of this aspect include corresponding systems, apparatuses, and other uses of a magnetic device.

The foregoing summary is illustrative only and is not intended to be in any way limiting. In addition to the illustrative aspects, implementations, and features described above, further aspects, implementations, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several implementations in accordance with the disclosure and are, therefore, not to be considered limiting of its scope, the disclosure will be described with additional specificity and detail through use of the accompanying drawings.

FIG. 8B. is a graph of a single-shot trace from an oscilloscope indicating the magnetization dynamics of a precessional switching event from P to AP to P then to AP in accordance with an illustrative implementation.

FIG. 12A illustrates the correlation between $\tau_{start}$ and $\tau_{switch}$ for P to AP switching for −0.61 V, 2 ns pulses in accordance with an illustrative implementation.

FIG. 12B illustrates the correlation between $\tau_{start}$ and $\tau_{switch}$ for AP to P switching for −0.61 V, 2 ns pulses in accordance with an illustrative implementation.

FIG. 13A illustrates the correlation between $\tau_{start}$ and $\tau_{switch}$ for P to AP switching for −0.64 V, 4 ns pulses in accordance with an illustrative implementation.

FIG. 13B illustrates the correlation between $\tau_{start}$ and $\tau_{switch}$ for AP to P switching for −0.64 V, 4 ns pulses in accordance with an illustrative implementation.

Figure 1:
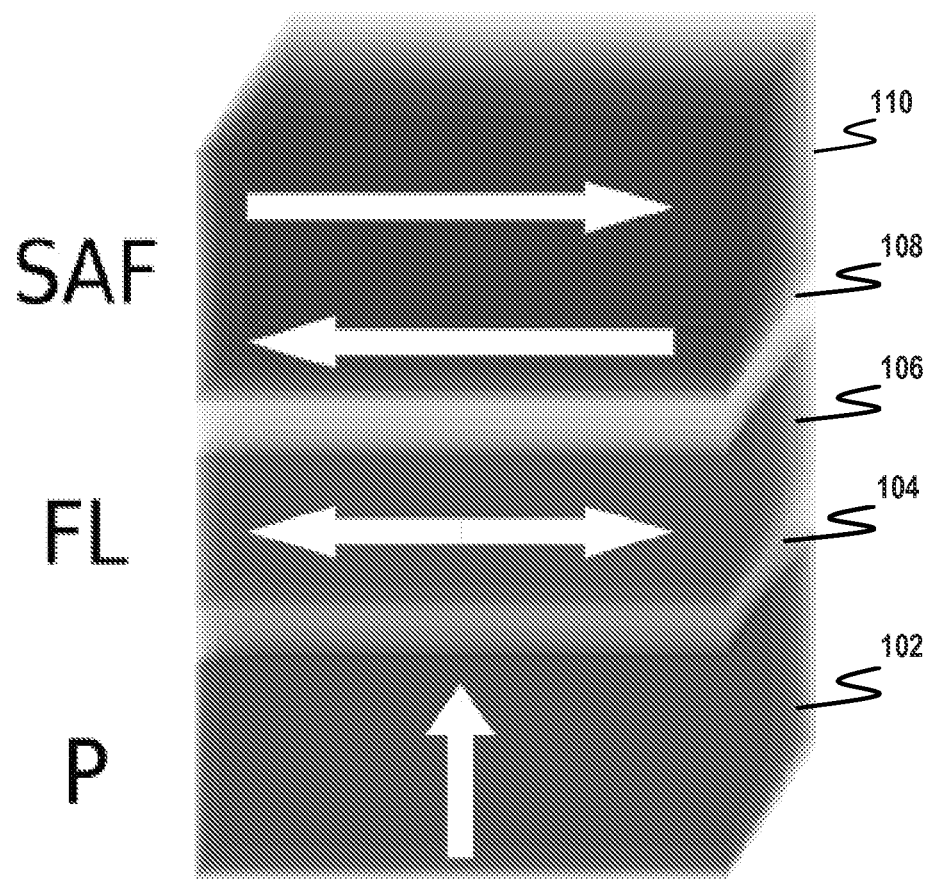
FIG. 1 illustrates an orthogonal spin transfer MRAM layer stack in accordance with an illustrative implementation.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Orthogonal Spin Transfer MRAM

In contrast to collinear devices, orthogonal spin transfer magnetic random access memory (MRAM) employs a spin-polarizing layer magnetized perpendicular to a free layer to achieve large initial STTs and has the potential for write times below 50 ps. This geometry has significant advantages over collinear magnetized STT-MRAM devices. First of all, the STT is large in both initial and final magnetic states of the free layer. This ideally will eliminate the incubation delay and reduce the stochastic nature of the switching. Secondly, the switching process can be very fast. When the current is large enough, the STT from the polarizer to the free layer will tilt the free layer magnetization out of its easy-plane and create a large demagnetization field. Depending on the angle of the tilt and the saturation magnetization of the free layer, this demagnetization field can be as large as tens or even hundreds of millitesla, which in most cases will become the dominate field applied on the free layer magnetization. Then this tilted free layer magnetization will start to precess about the demagnetization field and the period of the precession can be as fast as tens of picoseconds. Furthermore, one can achieve so-called "deterministic switching" by designing the pulse shapes to reverse the magnetization. The first half of the pulse can drive the magnetization out of plane while it rotates 90° from the initial position. And then by changing the pulse polarity in the second half, the magnetization will be pushed back into its easy-plane while it finishes the next 90° rotation. Finally, for the fast switching process, one could expect reduced energy consumption as compared with the traditional collinear devices.

The switching behavior of the orthogonal devices has further differences from with the collinear devices as well. First of all, there is "bi-polar switching," which means both the positive and negative pulse polarities can switch the magnetization direction in either case, i.e. P to AP and AP to P switching. The free layer magnetization can be tilted up or down from its easy plane. In either case a demagnetization field will be generated and drive the magnetization to precess. There is also "unipolar switching," which means one pulse polarity can switch the magnetization direction both from P to AP and from AP to P states. In traditional collinearly magnetized devices, the pulse polarity generally determines the free layer's (FL) final state (either P or AP). Finally, as mentioned before, the switching process can be precessional and the switching probability will oscillate between 1 and 0 for the pulse durations, which can be approximately T, 2T, 3T and so on. Although the pulses do not need to be accurately T, 2T, 3T and so on.

Finally, in order to readout the magnetization direction of the free layer, a magnetic tunnel junction (MTJ) can be integrated on top of the free layer. This readout layer will also provide spin torques as those in a traditional collinearly magnetized device, which will favor one of the switchings, i.e. AP to P switching and P to AP switching, for a given pulse polarity. The composition and structure of the final device is discussed below.

The various orthogonal spin transfer MRAM devices will be understood more readily be reference to the following example, which are provided by way of illustration and is not intended to be limiting in any way.

Example Structure and Characterization

In one example, an orthogonal spin transfer MRAM layer stack was grown on 150 mm diameter oxidized silicon wafers using a Singulus® TIMARIS™ PVD module. The device layer structure is illustrated in FIG. 1. Generally, the layer stack includes a perpendicularly magnetized polarizer (P) 102 that is separate by a non-magnetic metal 104 from a free magnetic layer (FL) 106. The free magnetic layer 106 forms one electrode of a MTJ. The other electrode is a reference layer 110 that includes a synthetic antiferromagnetic (SAF). Continuing the specific example, the polarizer consists of a Co/Pd multilayer exchange coupled to a Co/Ni multilayer. The Co/Ni multilayer has a high spin polarization due to the strong spin-scattering asymmetry of Co/Ni and a perpendicular magnetic anisotropy (PMA). To enhance the layer coercivity and remanence this layer is coupled to Co/Pd which has a very large PMA but a lower spin polarization due to the strong spin-orbit scattering by Pd. The polarizer is separated by 10 nm of Cu from an in-plane magnetized CoFeB free layer that is one of the electrodes of a MTJ. To reduce the dipolar field acting on the free layer from the reference layer of the MTJ, a synthetic antiferromagnetic (SAF) layer is employed. The total MTJ structure is 3 CoFeB/0.8 MgO/2.3 Co0.4Fe0.4B0.2/0.6 Ru/2 Co0.7Fe0.3/16 PtMn (layer thicknesses in nm). The wafer was annealed at 300° C. for 2 hours in a magnetic field and then characterized by vibrating sample magnetometry (VSM), ferromagnetic resonance spectroscopy (FMR), and current-in-plane-tunneling (CIPT) measurements. In other implementations, different materials can be used for each layer.

Figure 2:
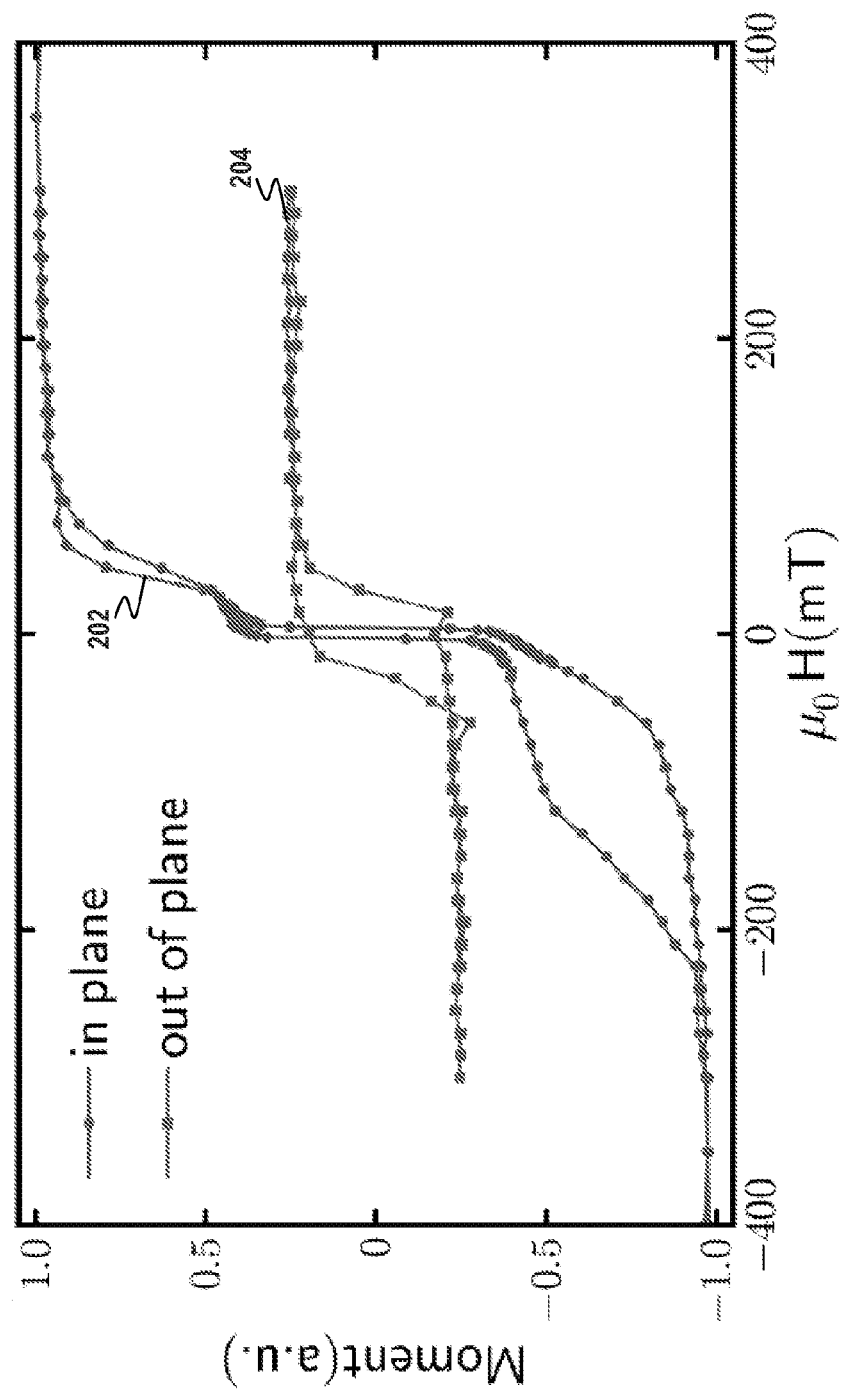
FIG. 2 illustrates VSM measurements of the magnetization of the orthogonal spin transfer MRAM layer stack in accordance with an illustrative implementation.

FIG. 2 illustrates VSM measurements of the magnetization of the orthogonal spin transfer MRAM layer stack in accordance with an illustrative implementation. Specifically, the VSM measurements of the film magnetization for in-plane and perpendicular-to-the-plane applied fields are shown. The curve 202 shows the switching of the free layer and SAF under an in-plane applied filed. The curve 204 shows the characteristics of the polarizing layer, under a field perpendicular to the plane, demonstrating the high remanence and a coercive field of 26 millitesla (mT). The CoFeB layers are very soft while the CoFe layer has a coercive field of about 50 mT; the exchange bias from the antiferromagnetic PtMn is 100 mT. The perpendicular polarizer has a coercive field of 26 mT.

The wafers were patterned to create orthogonal spin transfer MRAM devices using e-beam and optical lithography. Ion-milling was used to etch sub-100 nm features through the free layer. Device sizes varied from 40 nm×80 nm to 80 nm×240 nm in the form of rectangles, ellipses and hexagons. The results reported below were obtained on 60 nm×180 nm and 85 nm×200 nm hexagon shaped devices; similar results have been obtained on other devices of this type.

Figure 3:
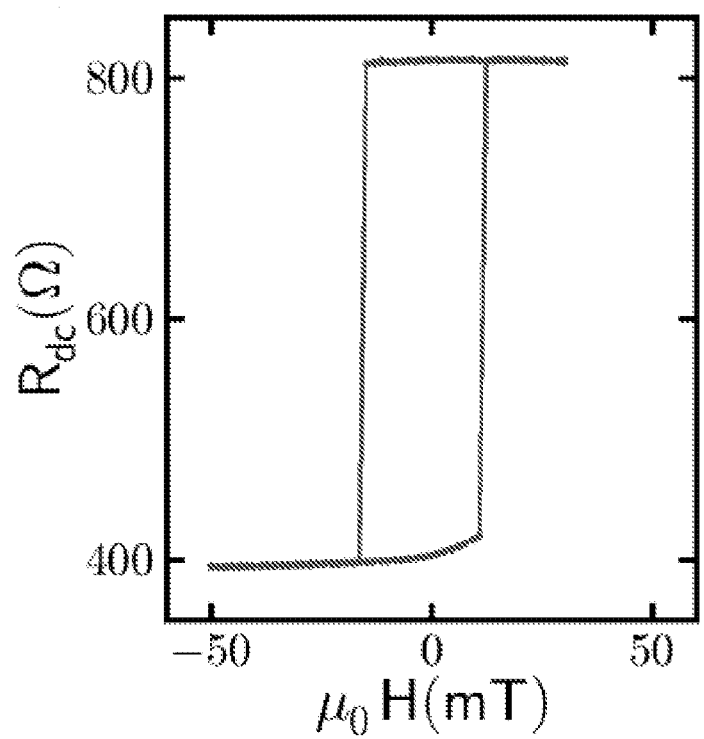
FIG. 3 shows the minor hysteresis loop of the free layer in accordance with an illustrative implementation.

The sample resistance was measured by applying a small voltage ($V_{dc}$=30 mV) and measuring the current. The MR of the device is mainly determined by the relative orientation of the free (3 nm CoFeB) and reference (2.3 nm CoFeB) layers, which can be either parallel (P) or antiparallel (AP). FIG. 3 shows the minor hysteresis loop of the free layer in accordance with an illustrative implementation. In FIG. 3, the device resistance versus the in-plane field shows a 107% MR and the switching of the free layer from the P to AP state at 12 mT and the AP to P state at −16 mT. The patterned free layer has a coercive field of 14 mT at room temperature and the device has 107% MR. The loop is centered at about −2 mT, due to a small residual dipolar coupling from the SAF reference layer. The hysteresis loops of more than 10,000 devices have been measured. The measured devices typically have TMR ratios of 100% or higher and resistance area (RA) products of about 8 $\Omega\mu m^2$.

Sample Electrical Contact Layouts and Preparation for Time Resolved Measurements For time-resolved measurements of the example device described above and other orthogonal spin transfer MRAM devices, one big change of the measurement circuit from the statistical measurements is the need to use a fast oscilloscope. The bottom electrode of the MTJ sample is electrically connected with the two outside pads. This connection prevents putting the oscilloscope in series with the sample to get a big signal change during switching. Therefore modifications need to be made to the sample layout in order to make time-resolved measurements.

Since the electrical connection with the two outside pads is really superficial, only several hundreds of nanometers deep from the surface, we can scratch the connection off by using a needle with a diamond tip. The resistance between the bottom electrode and the outside grounding pads are typically around 20 ohms (Ω) before scratching and above 20 kΩ afterwards. Since the oscilloscope has only a 50Ω input impedance, most of the current going through the sample will then also go through the oscilloscope.

As the connection is scratched deeper an deeper, the resistance between the bottom electrode and the outside grounding pads becomes larger and larger, such that the configuration approaches where the oscilloscope is in series with the sample. However, the sample can be damaged during the scratching process. Therefore, only a little bit is scratched at any time and the resistance is measured afterwards. As soon as the resistance is larger than 20 kΩ, the oscilloscope can be considered as being in series with the sample and the scratching process can stop.

Fast Switching in Orthogonal Spin Transfer MRAM Devices

Fast Switching Below a Nanosecond

To measure the current-induced switching probability, pulses of variable amplitude, duration and polarity were applied to the orthogonal spin transfer MRAM layer stack. An applied field can be used to set the layer stack into the bistable region, which is shown in FIG. 3. Voltage pulses can then be applied, using a pulse generator that provides up to 2 V amplitude with a minimum pulse duration of 50 ps. By measuring the resistance using a small DC voltage before and after the pulse, the device state can be determined. Since the free layer is very stable without any applied voltage (see the discussion below), a switching event (i.e., dynamics of the free layer magnetization to a point at which the free layer magnetization would reverse in the absence of the pulse) is assumed to have occurred during the voltage pulse. Positive voltage is defined to correspond to electrons flowing from the bottom to the top of the layer stack, i.e. from the polarizer toward the free and reference layers.

Figure 4:
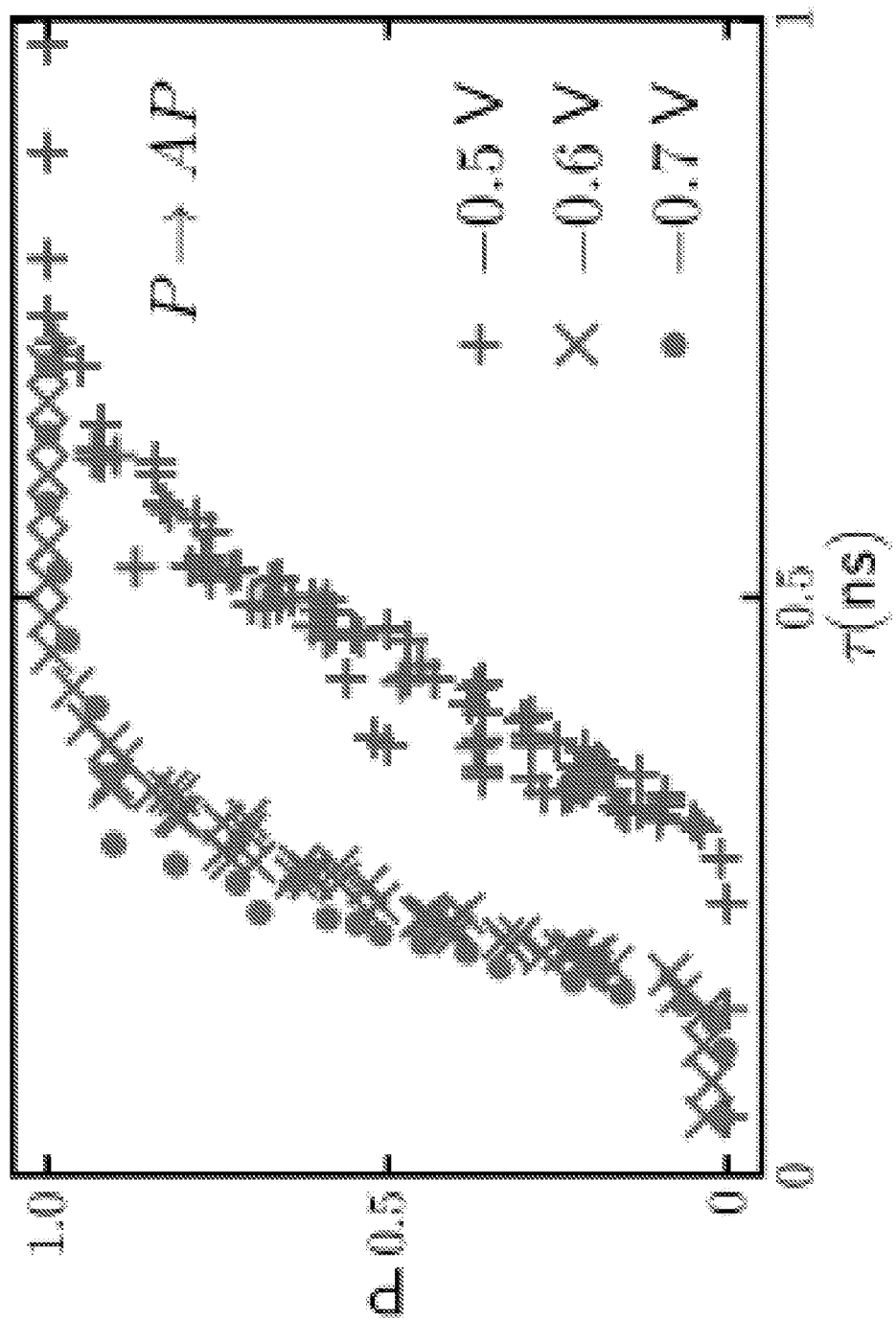
FIG. 4 shows the switching probability from the P to the AP state as a function of pulse duration in an applied field of 10 mT for three different pulse amplitudes, −0.5, −0.6 and −0.7 V in accordance with an illustrative implementation.

FIG. 4 shows the switching probability from the P to the AP state as a function of pulse duration in an applied field of 10 mT for three different pulse amplitudes, −0.5, −0.6 and −0.7 V. Higher amplitude pulses lead to switching at shorter pulse durations. We observe the sample switches 1000/1000 events with pulses less than 500 ps. To calculate the energy needed for 100% probability switching, a pulse at −0.6 V and 500 ps was chosen. Since the sample resistance varies from 400Ω to 800Ω, the energy for switching is between 225 fJ and 450 fJ. Switching probability of 100% was observed for pulses as short as 500 ps, thus, there is no incubation delay of several nanoseconds as observed in conventional collinear or nearly collinearly magnetized devices. The switching process is, therefore, fast and predictable.

To determine the energy barrier of the reversal, we measured the coercive field of the sample at different field sweep rates. The energy barrier is then determined from the relation:

$$\tau = \tau_0 \exp\left[\xi_0\left(1 - \frac{H_{app}}{H_k}\right)^\alpha\right],$$

where $$\xi_0 = \frac{U_0}{kT},$$

me zero applied tied energy barrier over the thermal energy, with T=300 K.

Figure 5B:
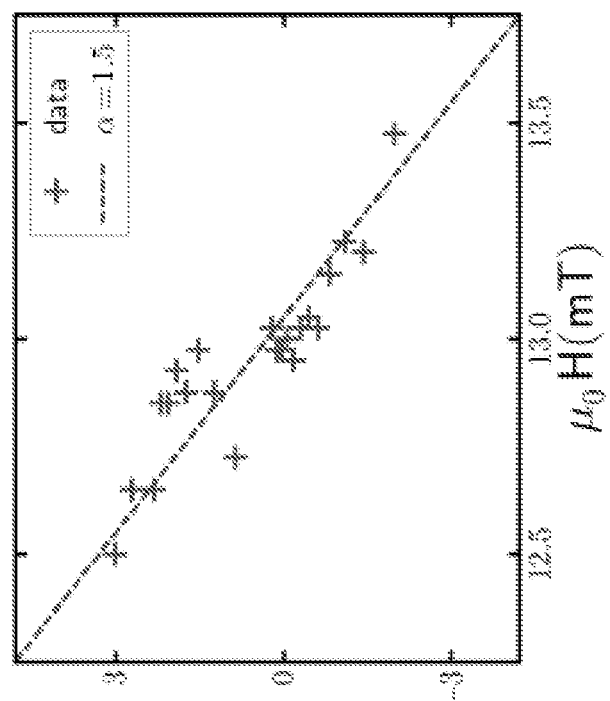
FIGS. 5A and 5B illustrate switching time as a function of applied field in accordance with an illustrative implementation.
Figure 5A:
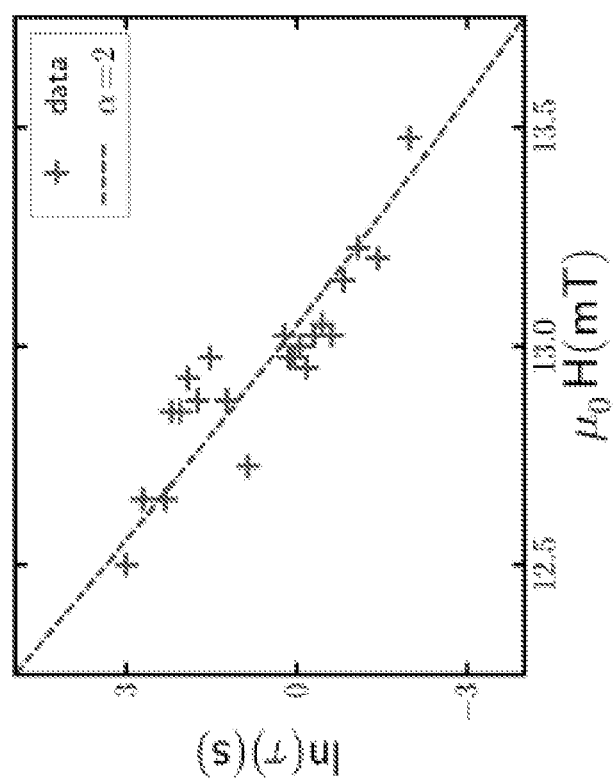

FIGS. 5A and 5B illustrate switching time as a function of switching field in accordance with an illustrative implementation. The switching field is obtained by averaging over ten hysteresis loops with the same field sweep rate, where the switching time equals the dwell time for a given applied field value. FIG. 5A uses $\alpha=2$ and FIG. 5B uses $\alpha=1.5$. Both parameters fit the data well. Although the data range is not wide enough to really determine the index $\alpha$ in the above equation, nevertheless, the almost linear alignment of the experimental data indicates at some linear expansion of either a parabola or a polynomial with a power of 1.5. This also suggests that a reasonable estimate of the energy barrier at $\mu_0 H=10$ mT can be obtained, where the pulse measurements are done later, since it is close to the measured field sweep region when compared with the value of $H_k$ from either fit. Assuming $\alpha=2$, an energy barrier of $\xi \approx 40$ at $\mu_0 H_{app}=0.01$ T is obtained, indicating the layer is very thermally stable at room temperature.

Unique Switching Probabilities

Figures 6A, 6B:
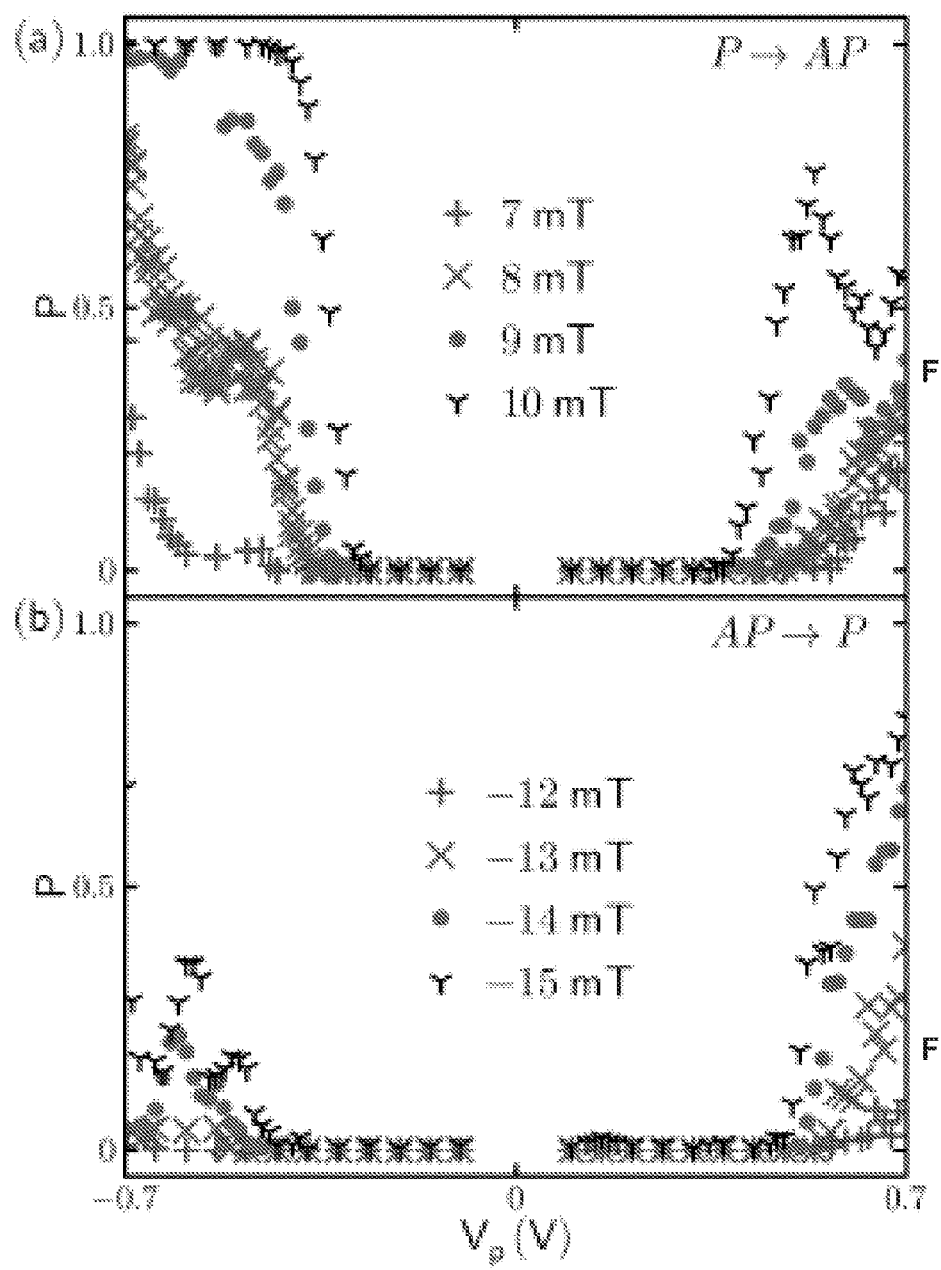
FIG. 6A shown the switching probability versus pulse amplitude for P→AP switching at a pulse duration of 700 ps.
FIG. 6B shown the switching probability versus pulse amplitude for AP→P switching at a pulse duration of 700 ps.

An important characteristic of described orthogonal spin transfer MRAM devices is that the switching is bipolar: switching between states occurs for both voltage pulse polarities. FIGS. 6A and 6B show the switching probability versus pulse amplitude for P→AP switching (FIG. 6A) and AP→P switching (FIG. 6B) at a pulse duration of 700 ps. In FIG. 6A the negative polarity pulses lead to higher switching probability than positive polarity pulses. The opposite is found in FIG. 6B for AP→P. In both cases applied fields closer to the coercive field lead to a lower voltage pulse threshold for switching. Also the switching probability is a nonmonotonic function of the pulse amplitude.

This is distinct from the characteristics seen in common collinear free layer/MgO/SAF type STT devices. In these devices switching only occurs for one polarity of the voltage pulse, or through thermally induced backhopping. In contrast, in various orthogonal spin transfer MRAM devices implementations switching occurs for both polarities. This bipolar switching process is a clear indication that the torque originates from the perpendicular polarizer. For a collinear device we would expect P→AP switching only for positive polarity pulses, based on spin-transfer torque models. In various implementations of orthogonal spin transfer MRAM devices, the positive polarity leads to a lower switching probability (FIG. 6A) compared to the opposite polarity. If the switching processes involved simple heating of the junction, a symmetric switching probability distribution and a monotonic dependence of the switching probability on pulse amplitude would be expected.

The data are qualitatively consistent with precessional reversal being driven by the perpendicular polarizer. The spin-torque due to the polarizer leads to a torque that rotates the free layer magnetization out of the film plane. This produces a demagnetization field perpendicular to the film plane around which the free layer magnetization precesses. Precession will occur for both signs of the current, since in both cases the free layer magnetization is tilted out of the film plane. The free layer magnetization rotation about its demagnetizing field will result in a switching probability that is a nonmonotonic function of the pulse amplitude or duration, since if the pulse ends after the free layer magnetization finishes a full rotation (i.e., a $2\pi$ rotation), the probability of switching will be reduced. The precession frequency may also be function of the pulse polarity due to the fringe fields from the polarizing and reference layers. Further, spin-torques from the reference layer break the symmetry of the reversal by adding torques that favor one free layer state over another. Micromagnetic modeling and modeling of the spin-transport processes in these layer stacks is can be used to gain a better understand the switching processes. Time-resolved experiments, discussed below, are also useful in better characterizing the short time magnetization in orthogonal spin transfer MRAM device structures.

Precessional Switching in Orthogonal Spin Transfer MRAM Devices

To study the magnetization dynamics, especially the magnetization switching processes in the orthogonal spin transfer MRAM devices, time-resolved measurements can be used. Directly probing the magnetization in real time can help in understanding the switching mechanisms. Described in greater detail below are results of time-resolved electrical measurements that probe the magnetization dynamics in orthogonal spin transfer MRAM devices with nanosecond duration current pulses. From these results, different switching mechanisms for parallel (P) to anti-parallel (AP) and AP to P switching under the same pulse conditions can be theorized and shown.

Figures 7A, 7B:
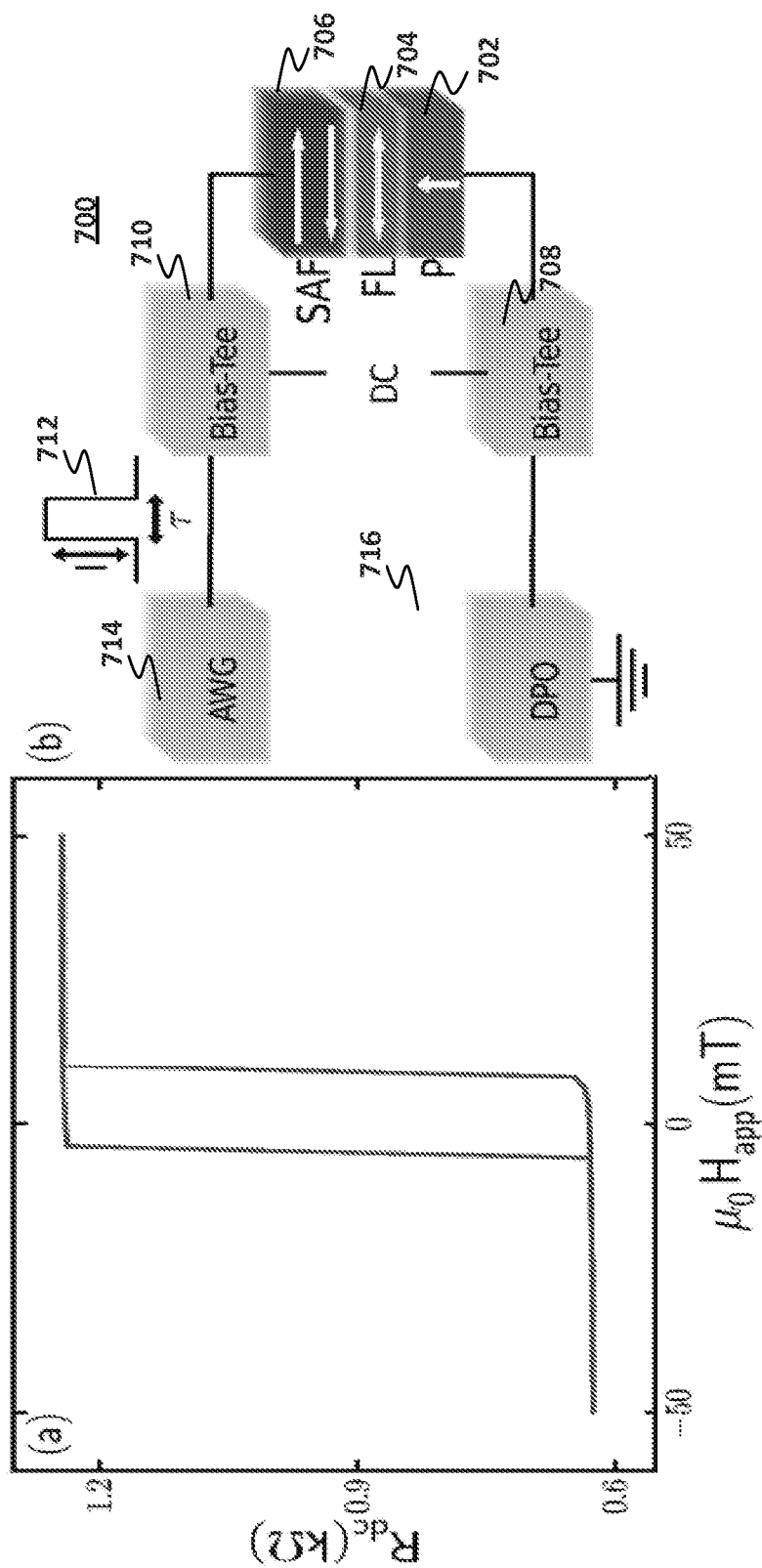
FIG. 7A is a graph of device resistance versus an in-plane field for a typical 85 nm×200 nm hexagon device at room temperature in accordance with an illustrative implementation.
FIG. 7B illustrates an experimental setup for time-resolved measurements in accordance with an illustrative implementation.

FIG. 7B illustrates an experimental setup 700 for time-resolved measurements in accordance with an illustrative implementation. The experimental setup includes an exemplary layer stack of an orthogonal spin transfer MRAM device. In one implementation, the layer stack of an orthogonal spin transfer MRAM device includes a perpendicular magnetized polarizing layer 702, an in-plane magnetized free layer 704 and a reference layer 706 that form a magnetic tunnel junction. To reduce the dipolar field acting on the free layer 704 from the reference layer 706, a synthetic antiferromagnetic (SAF) layer 706 can be employed. Based upon this structure, various devices can be made. For example, devices can be made with sizes varying from 40 nm×80 nm to 105 nm×250 nm and can be in the form of rectangles, ellipses and hexagons, virtually any useful shape. The resistance versus applied field (resistance hysteresis loops) of these devices can be measured. In various implementations, the devices can have tunneling magnetoresistance (TMR) ratios of 100% or higher and resistance area (RA) products of about 8 $\Omega\mu m^2$. FIG. 7A shows a minor resistance hysteresis loop (i.e. hysteresis in a field range in which only the device free layer switches) for an 85 nm×200 nm hexagon at room temperature. The P state resistance is 620 kOhms and the MR is 100%. The room temperature coercive field is 7 mT and the hysteresis loop is centered at 2 mT, as a result of a small residue coupling to the SAF.

To study the dynamics of the switching process, the experimental setup 700 illustrated in FIG. 7B can be used. The experimental setup 700 includes two bias-tees 708 and 710 used to separate the high frequency and the low frequency circuits. In the high frequency circuit, short (~ns) electrical current pulses 712 are generated by an arbitrary waveform generator (AWG) 714 and injected into the devices. During one series of measurements the rise and fall times of the pulse were about 200 ps. By putting a real-time oscilloscope, e.g., a digital phosphor oscilloscope (DPO), 716 with a 50 Ohm impedance in series with the device, the time variations of the current in the circuit can be measured. Since the circuit impedance is dominated by the device, the variation of the current in the circuit is proportional to the time variation of the device resistance. The latter can be determined by the relative magnetization orientations of the free and the reference layers during the pulse. The low frequency circuit can be used to measure the device resistance in equilibrium. In the time-resolved experiments, a small external magnetic field can be applied at or near the midpoint of the free layer hysteresis loop (i.e., 2 mT). Pulses can then be applied and the signals can be recorded in real time. The low frequency circuit can be used to measure the resistance of the device between the pulses, to determine whether the device has been switched by the pulse or not. The switched state of the device can be cross checked with that of the real time signals. Positive voltage can be defined as electrons flowing from the bottom to the top of the layer stack, i.e., from the polarizer toward the free and reference layers, 704 and 706, respectively.

Figure 8A:
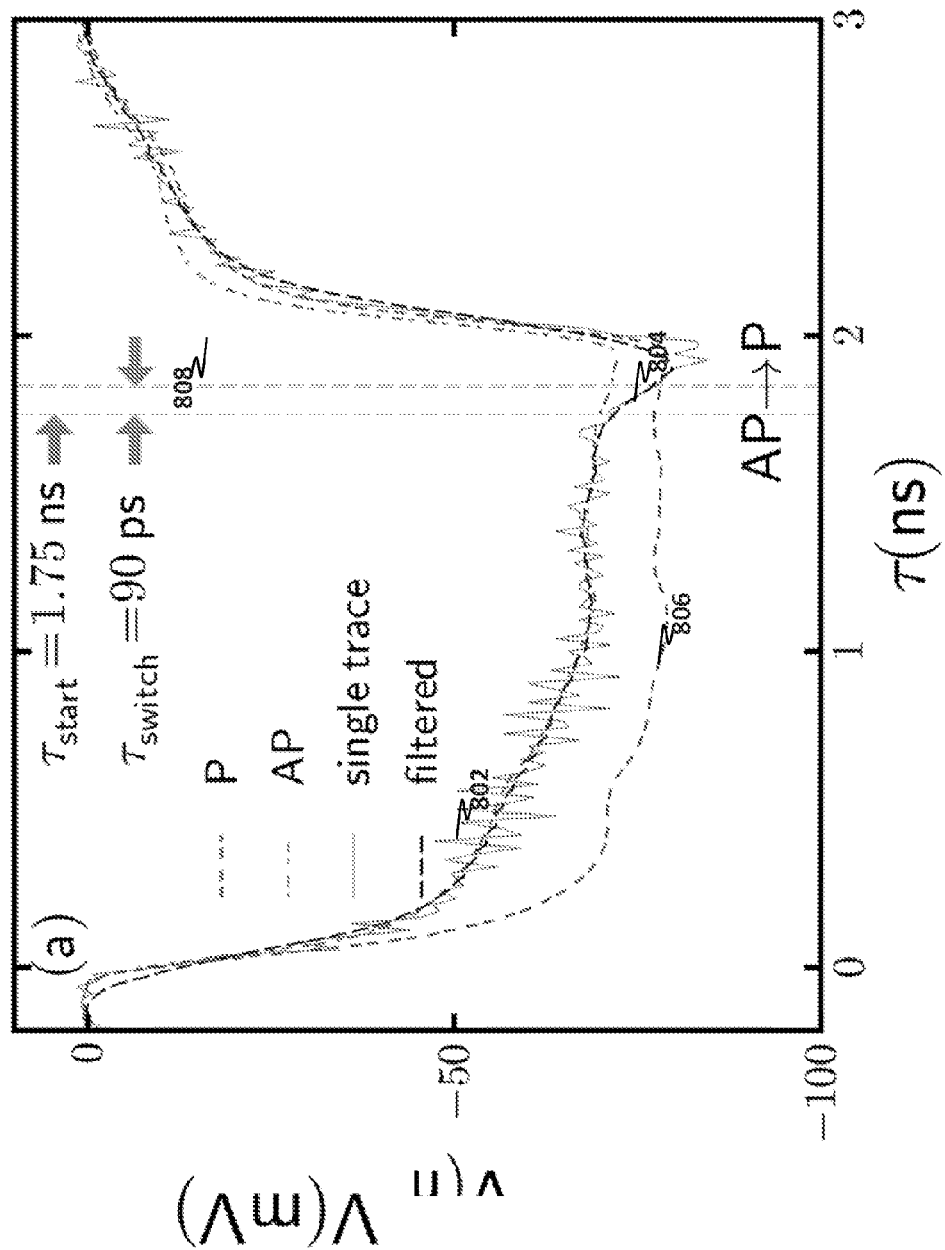
FIG. 8A. is a graph of a single-shot trace from an oscilloscope indicating the magnetization dynamics for an AP to P switching event in accordance with an illustrative implementation.
Figure 8C:
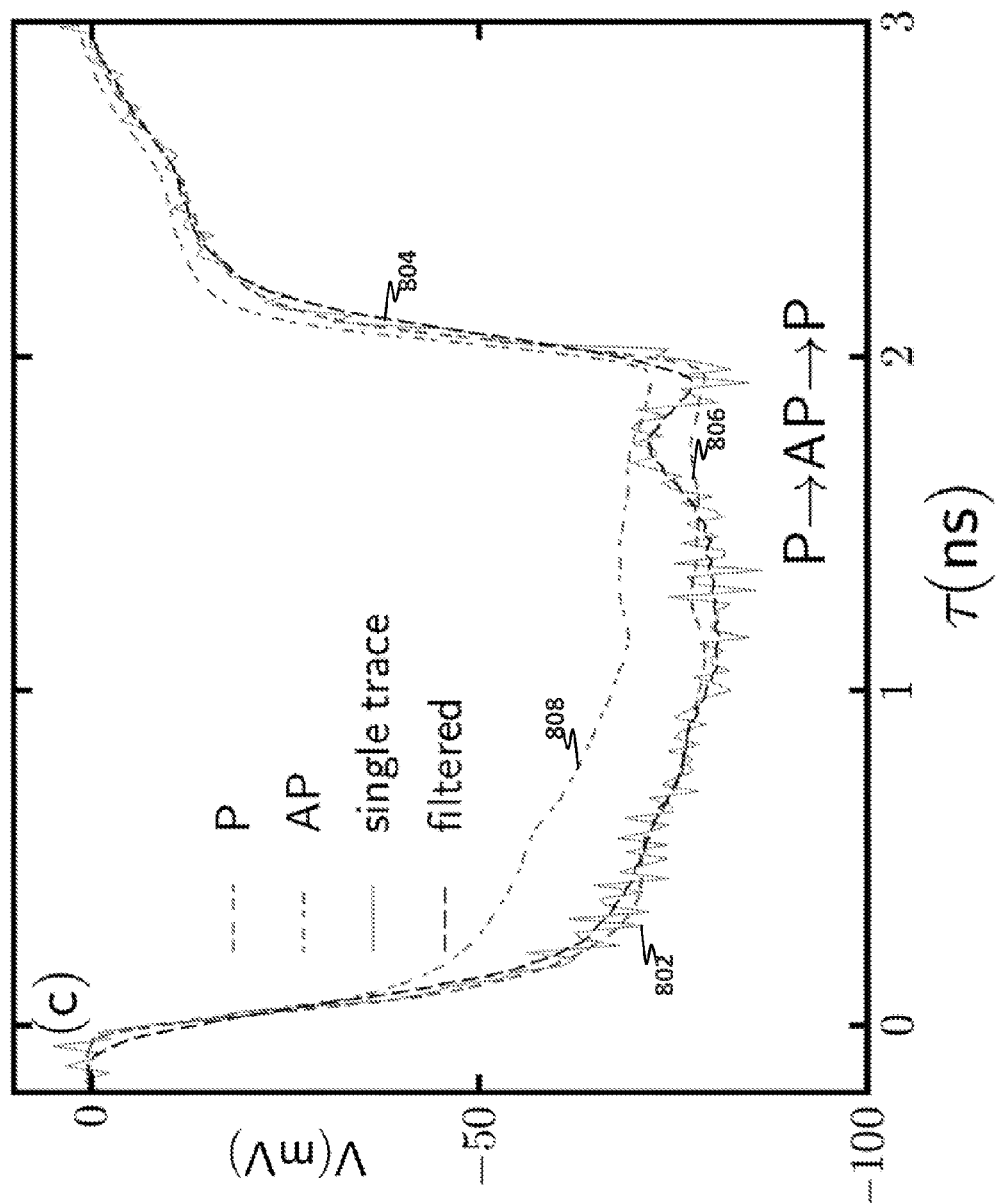
FIG. 8C. is a graph of a single-shot trace from an oscilloscope indicating the magnetization dynamics for an oscillation from P to AP then back to P in accordance with an illustrative implementation.

FIGS. 8A-8C show the single-shot traces of the voltage signal across the oscilloscope 716 for a −0.78 V, 2 ns pulse from the pulse generator 714. The initiation time for the switching can be reduced to less than 500 ps. The voltage used, however, can be such that both switching and non-switching events as well as different switching mechanisms between AP to P and P to AP for the same pulse conditions can be observed. Different voltages can be used to illustrate and utilize the differences between switching AP to P and P to AP. First curves 802 plot the raw signals from the oscilloscope for one single pulse while second curves 804 are made from smoothing the raw signals, which serve as a guide to the eye. Due to the good signal to noise ratio, the device state can be determined from the single-shot traces without averaging. For comparison, third curves 806 in all the subplots are averaged single-shot traces for the cases where the device is at the P state both before and after one pulse. Correspondingly, fourth curves 808 are the averaged "AP state" traces. For the same pulse configurations, both AP to P and P to AP switching can occur and are illustrated in FIGS. 8A-8C. FIG. 8A shows a typical AP to P switching event. In the beginning of the pulse, the signal is close to the averaged AP state trace, meaning the device is close to the AP state. Then the signal starts to deviate notably from the AP state at 1.75 ns; and the device reaches the P state 90 ps later, as shown by the vertical dashed lines. To determine the start time ($\tau_{start}$) and the transition time ($\tau_{switch}$) the single-shot voltage trace can be normalized to $V_{norm}(t)=(V(t)-V_p(t))/(V_{ap}(t)-V_p(t))$, where V(t) is the single-shot voltage trace, $V_p(t)$ is the averaged voltage trace for the P state and $V_{ap}(t)$ is the averaged voltage trace for the AP state. Switching can be defined as a deviation of more than 20% from either state. In other implementations, different percentages can be used to define switching, e.g., 15%, 22%, 25%, etc.

As illustrated in FIG. 8A, an AP to P transition can require one or two nanoseconds to initiate and the transition itself is fast and direct without precession. However, a typical transition from P to AP is precessional, as shown FIG. 8B. A device initially in the P state starts to oscillate between the AP and the P state after 1.2 ns, executing two oscillation periods (P to AP to P to AP) during the pulse.

FIG. 8C shows an event where the device begins and ends in the P state. The device undergoes an oscillation from P to AP then back to P state during the pulse. The oscillation starts at 1.6 ns, which is later than that in FIG. 8B where the device eventually switches to the AP state. More than 90% of the events that start from the P state and end in the P state have notable oscillations. As a result, the third curves 806, which are the average traces of all the start-and-end-in-P events, have a higher (negative) voltage than the true P state for τ≥1 ns. Therefore, in all three subplots, the single shot trace slightly crosses the averaged P state curve.

Determining the end state of the device from single-shot traces can be difficult, as during the falling edge of the pulse, the signals of the P and the AP states and their differences become smaller. In addition, the magnetic dynamics may not stop right at the end of the pulse. To account for this, the device state can be independently determined after each pulse by a direct current resistance measurement.

Figures 9A, 9B:
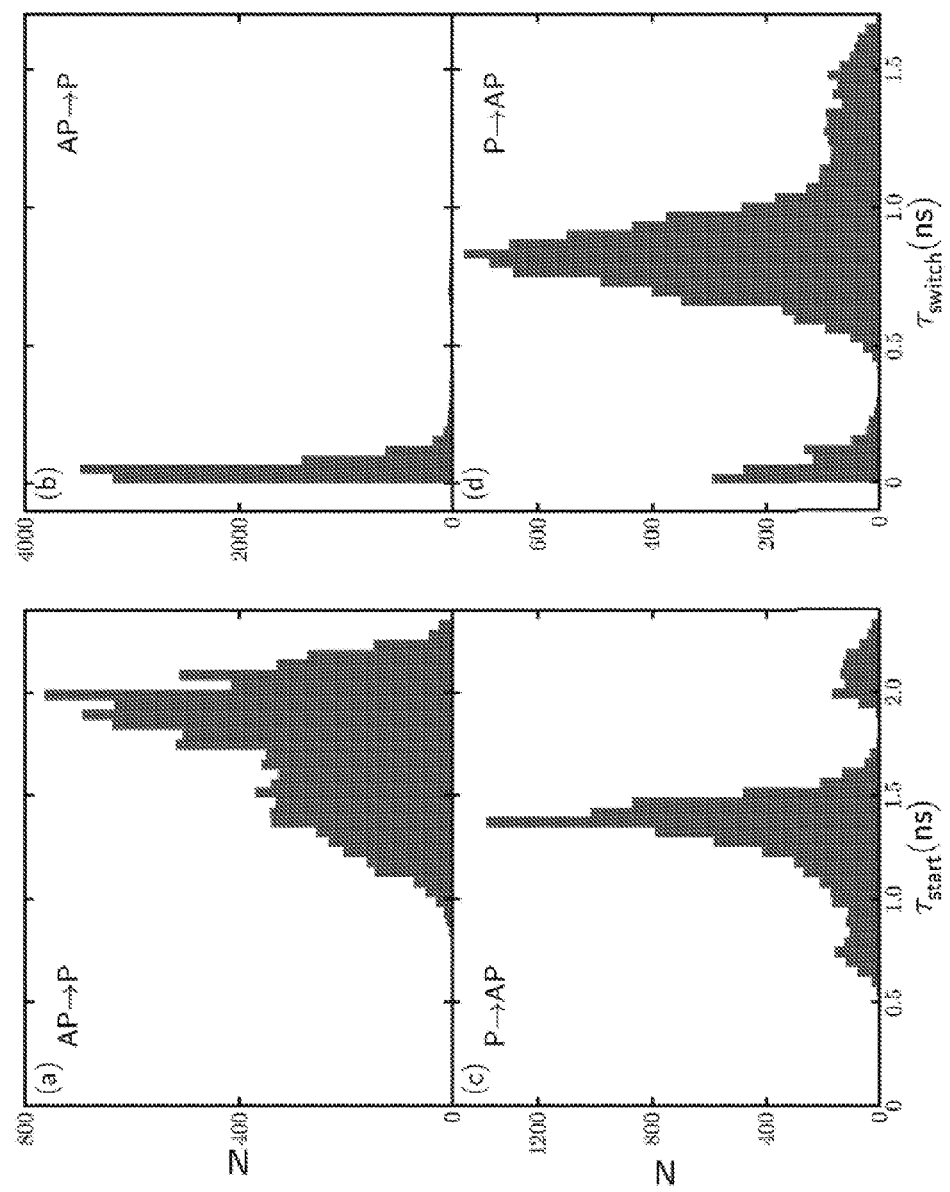
FIG. 9A illustrates histograms for a switching start time in accordance with an illustrative implementation.
FIG. 9B illustrates histograms for a switching time in accordance with an illustrative implementation.

FIGS. 9A and 9B show the distribution of $\tau_{start}$ and $\tau_{switch}$ for about 10,000 switching events. For negative voltage, the STT from the reference layer favors the P state. As a result, the AP to P switching has a higher probability (44%) than that of the P to AP switching (23%). As shown in FIG. 9A (the upper figure panel labeled (a)), for AP to P transitions, most $\tau_{start}$ values are between 1 and 2.4 ns; and switching events are more likely to occur later in the pulse. However, most of the transitions are very fast, occurring within 200 ps, as shown in FIG. 9B (the upper figure panel labeled (b)), which corresponds to a direct AP to P transition.

For P to AP switching, the start time peaks around 1.4 ns as shown in FIG. 9A (the lower figure panel labeled (c)), 500 ps earlier than that for AP to P switching. While the distributions for AP to P switching are unimodal, P to AP switching has a very pronounced bimodal distribution: some transitions take less than 200 ps while most transitions take around 800 ps. FIG. 9B (the lower figure panel labeled (d)) also shows a minimal number of switching events for transitions that take about 400 ps.

Figures 10A, 10B:
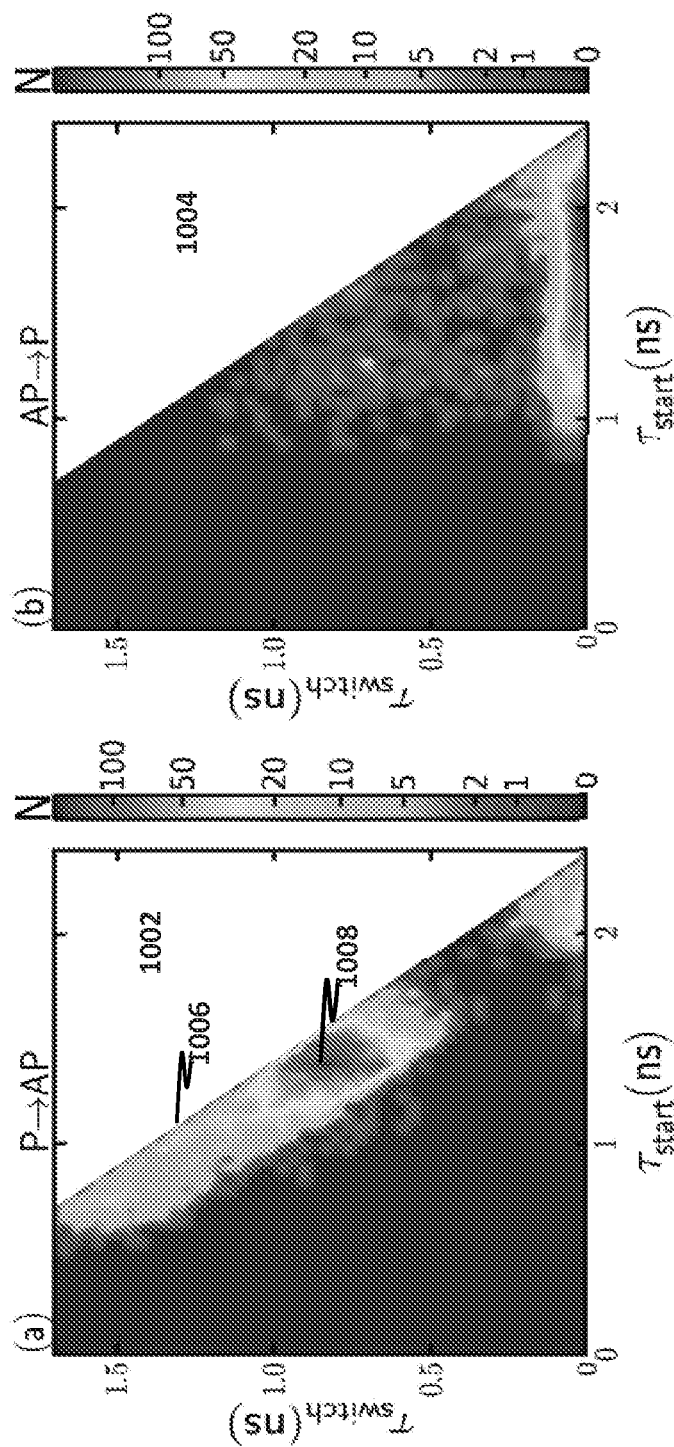
FIG. 10A illustrates the correlation between $\tau_{start}$ and $\tau_{switch}$ for P to AP switching in accordance with an illustrative implementation.
FIG. 10B illustrates the correlation between $\tau_{start}$ and $\tau_{switch}$ for AP to P switching in accordance with an illustrative implementation.

The correlation between $\tau_{start}$ and $\tau_{switch}$ is shown in FIG. 10A for P to AP switching and in FIG. 10B for AP to P switching. Both the x axis ($\tau_{start}$) and the y axis ($\tau_{switch}$) are divided evenly into a 500 by 500 grid, with the scale representing the number of switching events within of the grid's cells. The white regions 1002 and 1004 represent the limit of the pulse configuration since $\tau_{start}+\tau_{switch}$ must be less than the pulse duration plus the fall time (about 2.4 ns), the time window in which the signal can be resolved. For P to AP switching, as shown in FIG. 10A, almost all of the switching events are along this boundary 1006, i.e. 2 ns<$\tau_{start}+\tau_{switch}$<2.4 ns. This means the magnetization dynamics, once started, last until the end of the pulse. In the absence of thermal fluctuations, $\tau_{start}+\tau_{switch}$ can be equal to the pulse duration plus the fall time. Since the illustrated experiments were conducted at room temperature, this boundary is broadened by thermal fluctuations and occurs between 2 and 2.4 ns. Most P to AP switching events are centered at $\tau_{start}$=1.4 ns and $\tau_{switch}$=0.8 ns, as indicated by the region 1008 in the center of this plot. This corresponds to multiple oscillations between the P and AP states (P→AP→P→AP), as occurred in the event shown in FIG. 4B. Also there are very few switching events with 0.3 ns<$\tau_{switch}$<0.4 ns and 1.7 ns<$\tau_{start}$<1.8 ns. The absence of P to AP events in these time windows corresponds to the magnetization executing a full precessional cycle (P→AP→P), like the event shown in FIG. 8C. FIG. 10A demonstrates that the P to AP switching is precessional. Due to the pulse duration and the period of the oscillation, only oscillations starting in certain ranges of time lead to switching.

The AP to P switching mechanism dynamics is different from that of P to AP switching. For AP to P switching, as shown in FIG. 10B, most start times are between 1 and 2.4 ns. Further, they are typically less than 200 ps, faster than half of the oscillation period for the P to AP switching. Therefore the typical AP to P switching corresponds to the direct transition, similar to the event shown in FIG. 4A.

The direct transition between AP to P, yet precessional reversal for most P to AP switching under the same pulse configuration, can be explained by the torques acting perpendicular to the free layer plane. For a device initially in the AP state for the same pulse amplitude the current is smaller, since the device has a larger resistance in the AP than in the P state. Therefore, at the beginning of the pulse the STT from the polarizing layer will be smaller and perpendicular torque will not be sufficient to tilt the free layer magnetization out of plane far enough to cause the magnetization to precess. As a result, the switching process is similar to that of a traditional collinear device where the STT from the reference layer, which favors the P state, contributes to the switching process. The transition is then fast and direct with a relatively long initiation time. For a device initially in the P state, the current and therefore the perpendicular torque is large enough to initiate precession and once started is able to keep the precession going until the end of the pulse. The start time is also less than that for events that start in the AP state. Depending on the start time, the device will be closer to the P or to the AP state at the end of the pulse.

Precessional Switching for Both AP to P and P to AP Switching

Continuing from the above, it can be seen that if we keep increasing the pulse voltage, eventually both AP to P switching and P to AP switching will become precessional. Due to the breakdown voltage of the tunnel barrier, it is not possible to apply higher voltage for a long period, which prevents precessional switching for both AP to P and P to AP switching in all devices. However, for devices with smaller threshold and/or larger breakdown voltage, the transition between direct switching and precessional switching as the pulse amplitude increases can be observed.

Figures 11A, 11B:
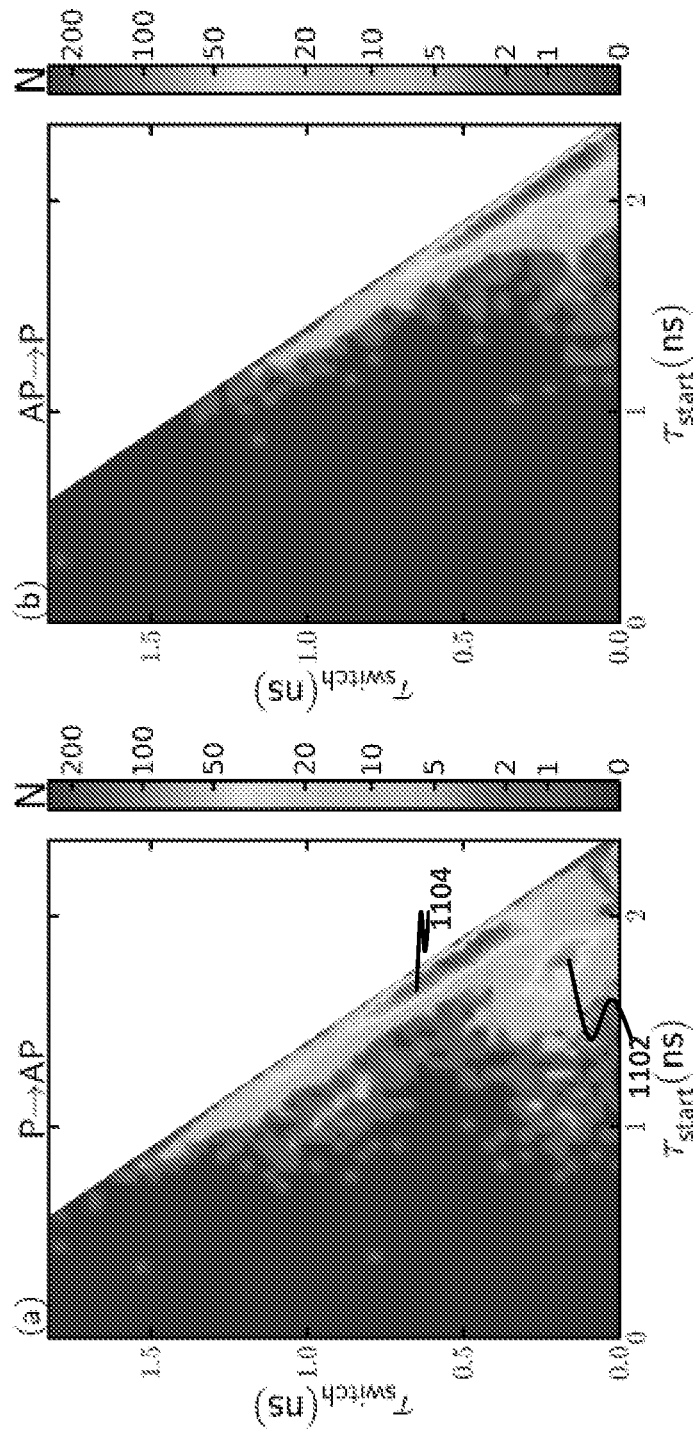
FIG. 11A illustrates the correlation between $\tau_{start}$ and $\tau_{switch}$ for P to AP switching for −0.57 V, 2 ns pulses in accordance with an illustrative implementation.
FIG. 11B illustrates the correlation between $\tau_{start}$ and $\tau_{switch}$ for AP to P switching for −0.57 V, 2 ns pulses in accordance with an illustrative implementation.

FIGS. 11A-13B show the correlation maps for a 80 nm×160 nm, hexagon device for both AP to P and P to AP switching for different pulse amplitudes and durations. This device has a 92% TMR with a room temperature coercive field of 6 mT. FIGS. 11A and 11B show the statistics for switching with −0.57V, 2 ns pulses over 10,000 events. From FIG. 11A, it can be seen that for P to AP switching, the switching events are concentrated around a peak 1102 at $\tau_{start}$=1.8 ns and $\tau_{switch}$=0.2 ns besides the boundary of $\tau_{start}+\tau_{switch}$=2.4 ns. This indicates that there are at least two different switching mechanisms for P to AP switching. One is direct switching as indicated by the isolated peak region 1102. The other switching mechanism(s), e.g., region 1104, must have a switching process that lasts till the end of the pulse. It can be either precessional or just switching back and forth with random intervals. For AP to P switching in FIG. 11B, the majority of the switching events are around $\tau_{start}$=2.2 ns and $\tau_{switch}$=0.2 ns, where the center of direct switching coincides with the boundary of the precessional switching. Therefore, the switching mechanism cannot be determined from the correlation plot alone. However, FIGS. 11A and 11B show that the start time for P to AP switching is in general earlier than the AP to P switching, as expected since there is a larger STT to initiate the switching in the P state than that in the AP state.

As the absolute value of the pulse voltage is increased, the switching correlation maps change as well. FIGS. 12A and 12B show the switching statistics for the same sample with −0.61 V and 2 ns pulses. FIG. 12A shows that the start times are in general shorter than those with −0.57 V pulses and the direct switching becomes less probable as the region 1202 of the direct switching (around $\tau_{start}$=1.8 ns and $\tau_{switch}$=0.2 ns) shrinks in size. Furthermore, the boundary of $\tau_{start}+\tau_{switch}$=2.4 ns begins to centralize around two different peaks ($\tau_{start}$=1.2 ns, $\tau_{switch}$=1.2 ns 1204 and $\tau_{start}$=1.8 ns, $\tau_{switch}$=0.6 ns 1206) and the probabilities of switching between the two peaks on the boundary are reduced. This suggests precessional switching in a similar way to that of the region 1008 and the non-switching zone in FIG. 10A. FIG. 12B shows the switching statistics for AP to P switching with −0.61V and 2 ns pulses, where a direct switching center can be clearly seen. This also indicates that there are multiple switching mechanisms for AP to P switching under this pulse configuration.

If the absolute value of the pulse amplitude and duration are both increased, the switching mechanisms continue to change. FIGS. 13A and 13B show the switching statistics with −0.64V and 4 ns pulses. From FIGS. 13A and 13B it is seen that there is no simple direct switching from either AP to P switching or P to AP switching as the magnetization dynamics almost always lasts till the end of the pulses. For P to AP switching, the start times are centered around 1 ns, which are shorter than those with pulse amplitudes at −0.57 V and −0.61 V. This agrees with the hypothesis that a larger voltage/current would induce a larger perpendicular STT to the free layer, resulting in a quicker start of the magnetization dynamics. For AP to P switching, almost all the switching events are at the boundary of $\tau_{start}+\tau_{switch}$=4.4 ns and with alternative peaks and gaps structures at the boundary. The gaps, such as 1304 (corresponding to less switching event than peaks, such as 1302) at larger start times are easier to observe, since the dynamics only lasts for around 1 ns, the precession is still coherent. It is hard to see the earliest gap at $\tau_{start}$=2.2 ns and $\tau_{switch}$=2.2 ns since there is more thermal influence in this longer duration of precession. As a result, the sharp on-off structures are smeared out. This indicates that the pulse amplitude here is still not large enough for a ballistic interpretation of the precession since the dynamics induced by the spin-transfer effects becomes nearly indistinguishable from thermally induced dynamics after 2 ns.

Figure 14B:
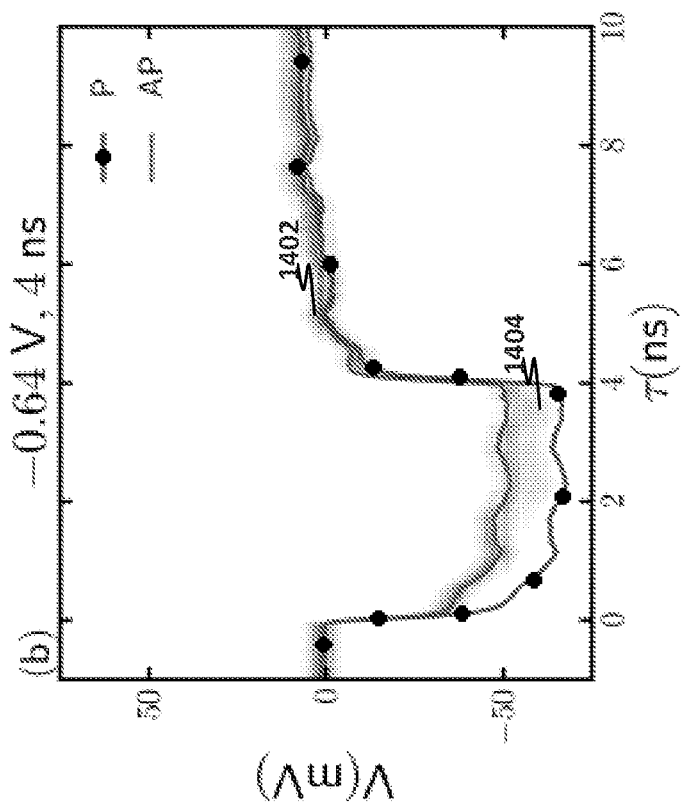
FIG. 14B illustrates a density plot of AP to P switching for −0.64 V, 4 ns pluses in accordance with an illustrative implementation.
Figure 14A:
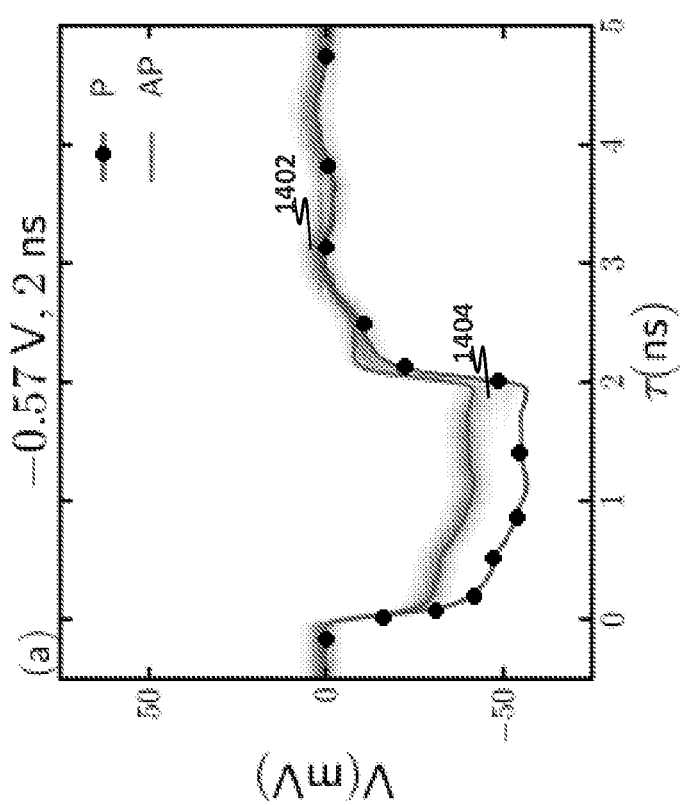
FIG. 14A illustrates a density plot of AP to P switching for −0.57 V, 2 ns pluses in accordance with an illustrative implementation.

All of the switching traces can be viewed in a density plot instead of their statistics, as shown from FIGS. 14A-17B. FIGS. 14A and 14B illustrate a density plot of over 10,000 AP to P switching events with −0.57 V, 2 ns pulses (FIG. 14A) and with −0.64 V, 4 ns pulses (FIG. 14B). The curves represent the averaged traces for the events where the device starts and ends both in P (AP) states, the same as those from FIGS. 8A-8C. The map area around the curves represents the density of data points on the switching signal traces for a pair of τ and V values. Darker regions 1402 of the map indicate all switching traces go through, lighter regions 1404 indicate some of the switching traces go through, and white areas indicate no switching traces. The density plot can be created directly from the digital readout of the oscilloscope. For example, the time (τ)-voltage (V) coordinates can be divided into 1000×256 cells according to the accuracy of the oscilloscope. Since each switching trace from the oscilloscope are 1000 pairs of corresponding time (τ) and voltage (V) values, the numbers of switching traces going through each cell are recorded and finally normalized among the cells with the same τ values. Then the normalized numbers can be assigned to regions and shown as the density plot. In one implementation, the different regions can be assigned different colors. For example, the region can be red, the region 1404 can be yellow, and white can be used to show regions where there are no switching traces. It can be seen from FIG. 14A that the switching traces with −0.57 V pulses coincide for most of their duration and only begin to diverge at the end of pulse, as the region 1402 covers most of the switching trace, leaving a smeared region 1404 between the AP and the P state only at the end of the pulse. This suggests that the switching is direct (and late) since the time span of the smeared region 1404 in FIG. 14A, which corresponds to the transition between the AP and P states, is short. However, the density plot for −0.64 V, 4 ns pulses in FIG. 14B is quite different. The smeared region 1404 fills almost everywhere between the P and AP states from 2 ns to the end of the pulse.

The majority of the switching events clearly deviates from the AP state and oscillates between the AP and P states from 3 ns to the end of the pulse. This shows that the main switching mechanism changes from the direction switching to precessional switching due to the increasing strength of the perpendicular spin torques, as the absolute value of the pulse voltage increases from −0.57 V to −0.64 V.

Figure 15B:
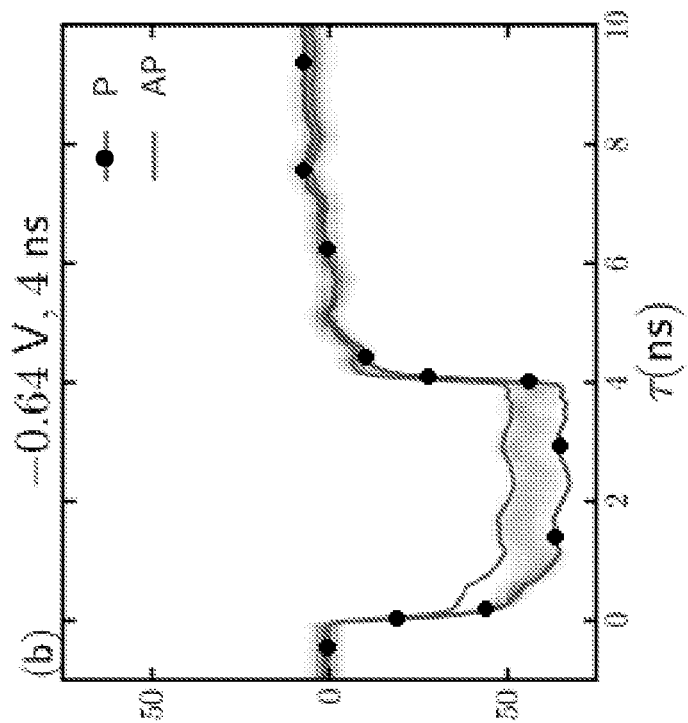
FIG. 15B illustrates a density plot of P to AP switching for −0.64 V, 4 ns pluses in accordance with an illustrative implementation.
Figure 15A:
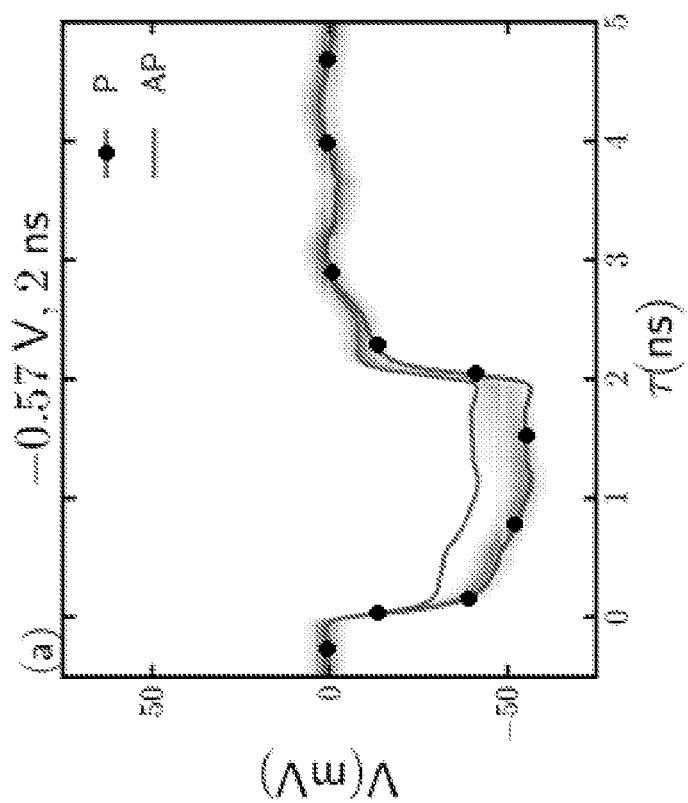
FIG. 15A illustrates a density plot of P to AP switching for −0.57 V, 2 ns pluses in accordance with an illustrative implementation.

A similar trend can be also observed from the P to AP switching events, as shown in FIGS. 15A and 15B. The oscillations start earlier for the P to AP switching (FIG. 15B) than those for the AP to P switching (FIG. 14B), in line with a larger perpendicular STT resulting in an earlier start to the precession.

Figures 16A, 16B:
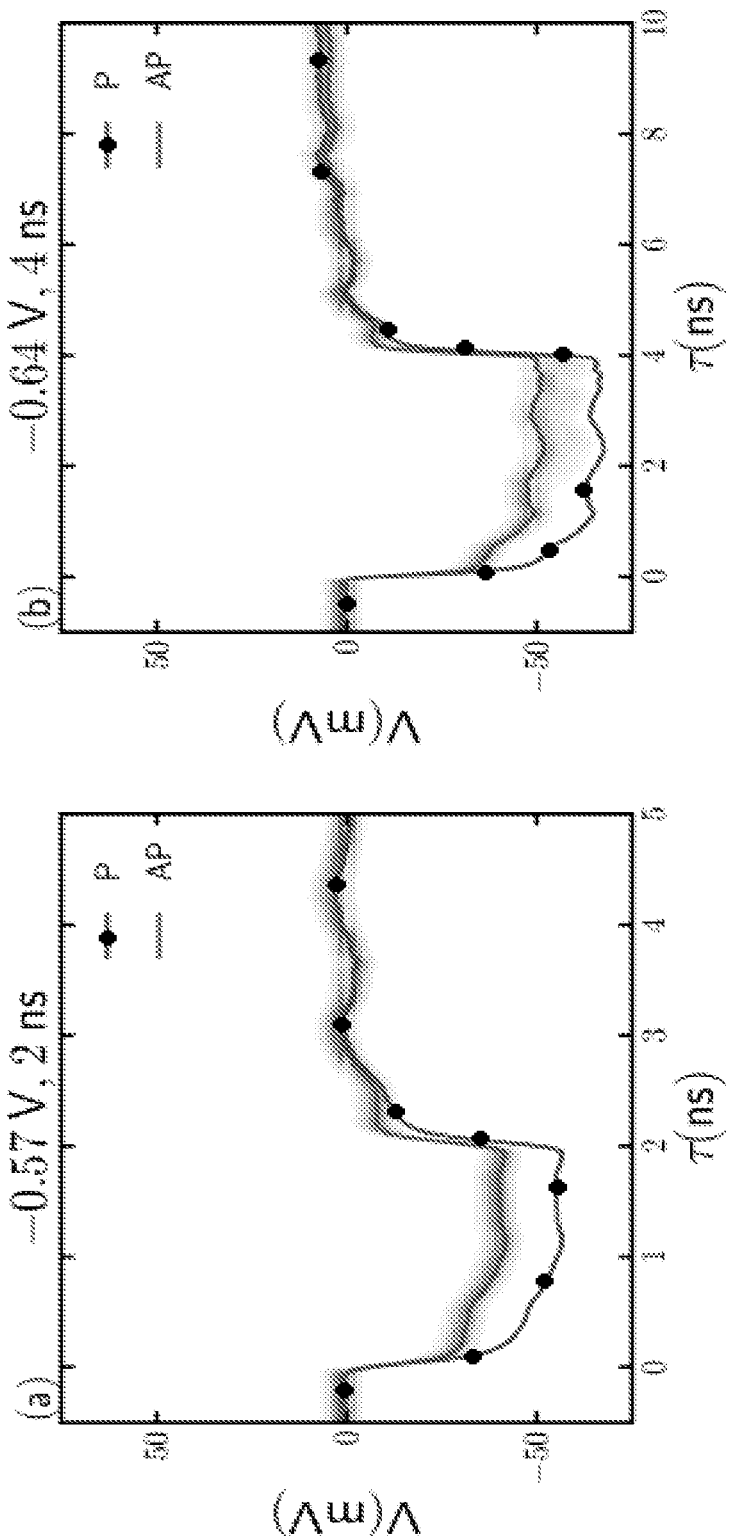
FIG. 16A illustrates a density plot of a device beginning and ending in the AP state for −0.57 V, 2 ns pluses in accordance with an illustrative implementation.
FIG. 16B illustrates a density plot of a device beginning and ending in the AP state for −0.64 V, 4 ns pluses in accordance with an illustrative implementation.
Figures 17A, 17B:
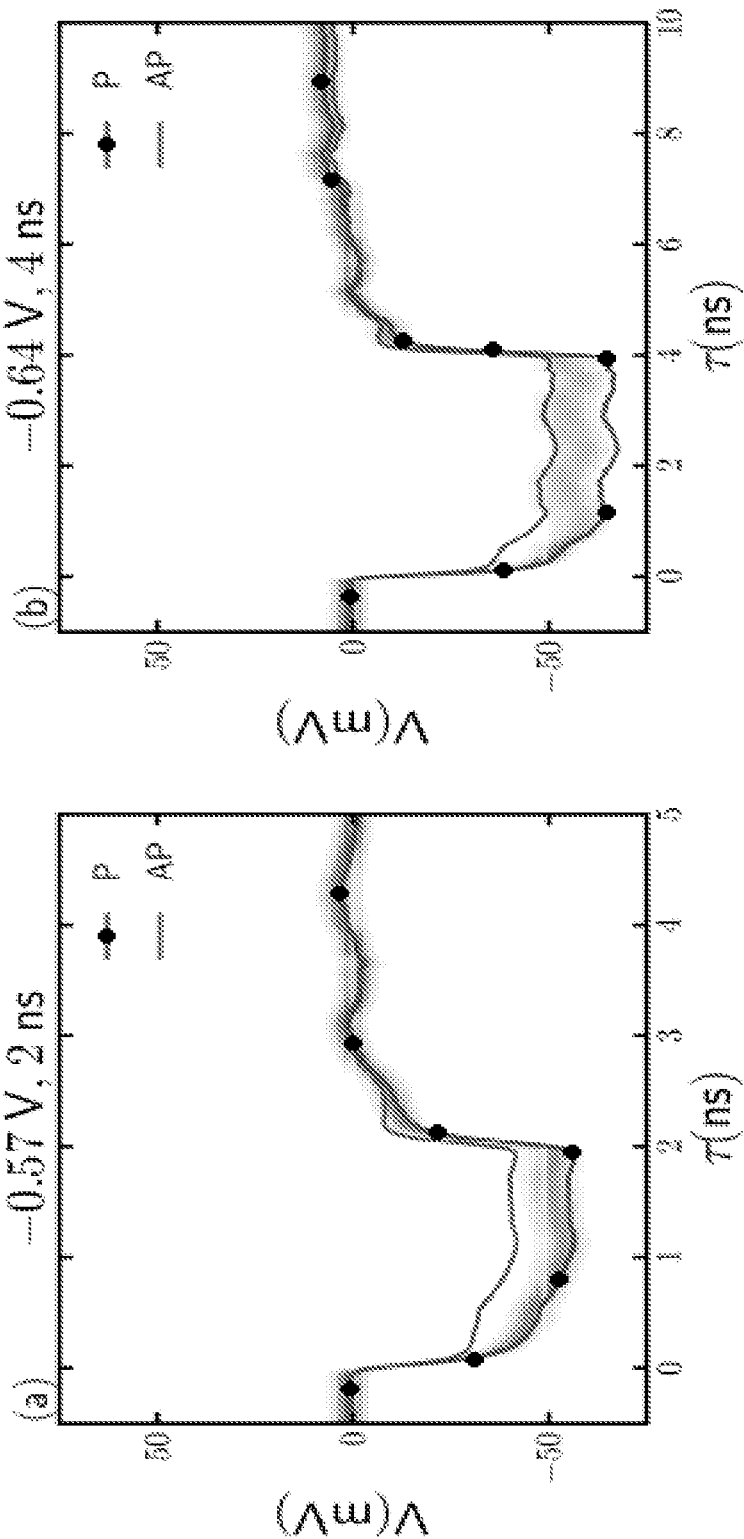
FIG. 17A illustrates a density plot of a device beginning and ending in the P state for −0.57 V, 2 ns pluses in accordance with an illustrative implementation.
FIG. 17B illustrates a density plot of a device beginning and ending in the P state for −0.64 V, 4 ns pluses in accordance with an illustrative implementation.

In addition to providing an overview of the switching events, the density plot can also be used to study the non-switching events. FIGS. 16A-17B show the non-switching events where the device is either in the AP state or the P state before the pulse. The majority of the signals are close to the P state in FIG. 16A and to the AP state in FIG. 17A all the time during the pulse when the amplitude is only −0.57V, whereas the majority of the signals oscillate between the P and the AP state when the absolute value of the pulse amplitude increases to −0.64 V, as shown in FIGS. 16B and 17B. This confirms that the major switching mechanism is direct switching for −0.57 V pulses yet precessional reversal for −0.64 V pulses.

Frequency of the Precession

As described above, precessional switching can be achieved when the perpendicular spin torques are large enough. A natural next step is to calculate the precession frequency. However, it is not straightforward to do since the oscillations obtained under the described pulse conditions are strongly influenced by thermal fluctuations. As a result, the individual switching traces are distorted from a constant angle precession about the demagnetization field and from the statistics of the start and switch times shown in FIGS. 13A and 13B, the precession lasts for only about 2 ns as discussed above.

Figure 18A:
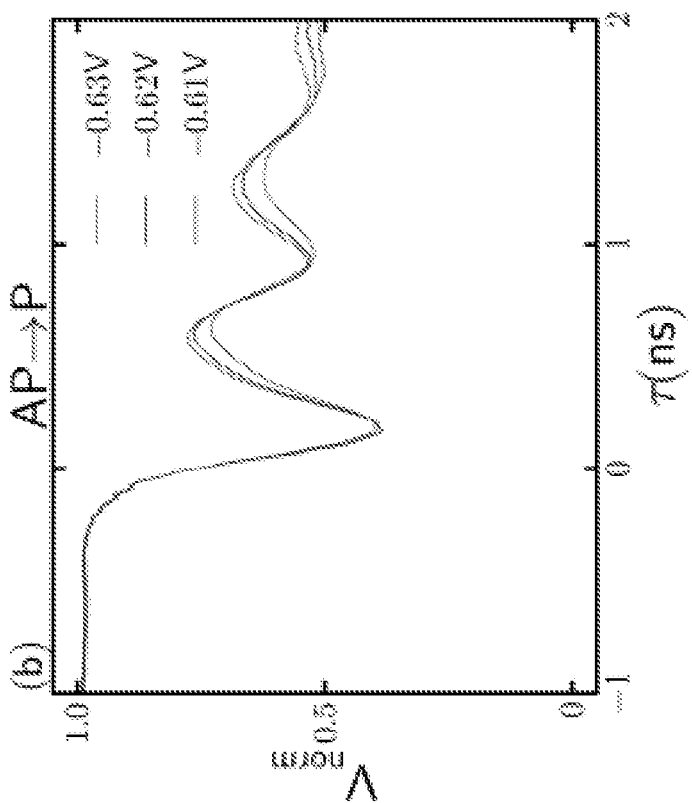
FIG. 18A illustrates the average of the normalized switching traces for P to AP switching in accordance with an illustrative implementation.
Figure 18B:
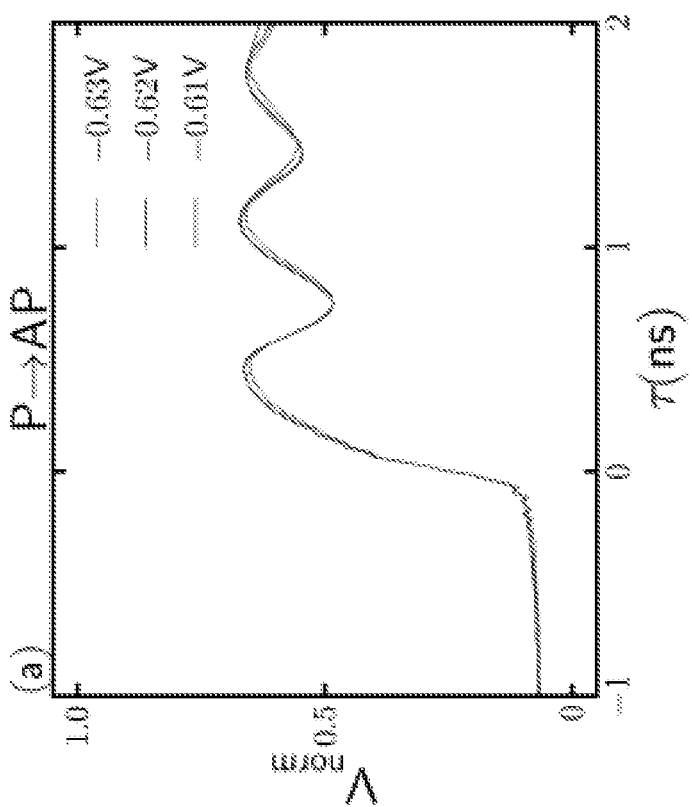
FIG. 18B illustrates the average of the normalized switching traces for AP to P switching in accordance with an illustrative implementation.

One way to get the frequency of the precession, is to average all the normalized switching traces with a shifted starting point so that τ=0 always corresponds to $V_{norm}$=0.2 for P to AP switching and $V_{norm}$=0.8 for AP to P switching. Recall that the switching signal is normalized in a way such that the AP state is 1 while the P state is 0. The reason for the shift is to remove the variable thermal initiation time of the switching to have all the oscillations start at the same time. FIGS. 18A and 18B shows the normalized switching traces for P to AP switching in FIG. 18A and AP to P switching in FIG. 18B for different pulse amplitudes. The oscillating traces can be seen after the average. The amplitude of the oscillation is reduced as time increases and the oscillations last for about 2 ns as expected from thermal fluctuations.

The oscillation curves can be fit with various functions. For example, the oscillation curves can be fit with a sine function with an exponentially decreasing amplitude, namely:

$$V_{norm}=A \cdot \exp(-B \cdot \tau) \sin(\omega t + \phi) + C,$$

where A, B and C are some constants, w is the angular frequency and 0 is some angle due to the choice of Vnorm at T=0.

Figure 19:
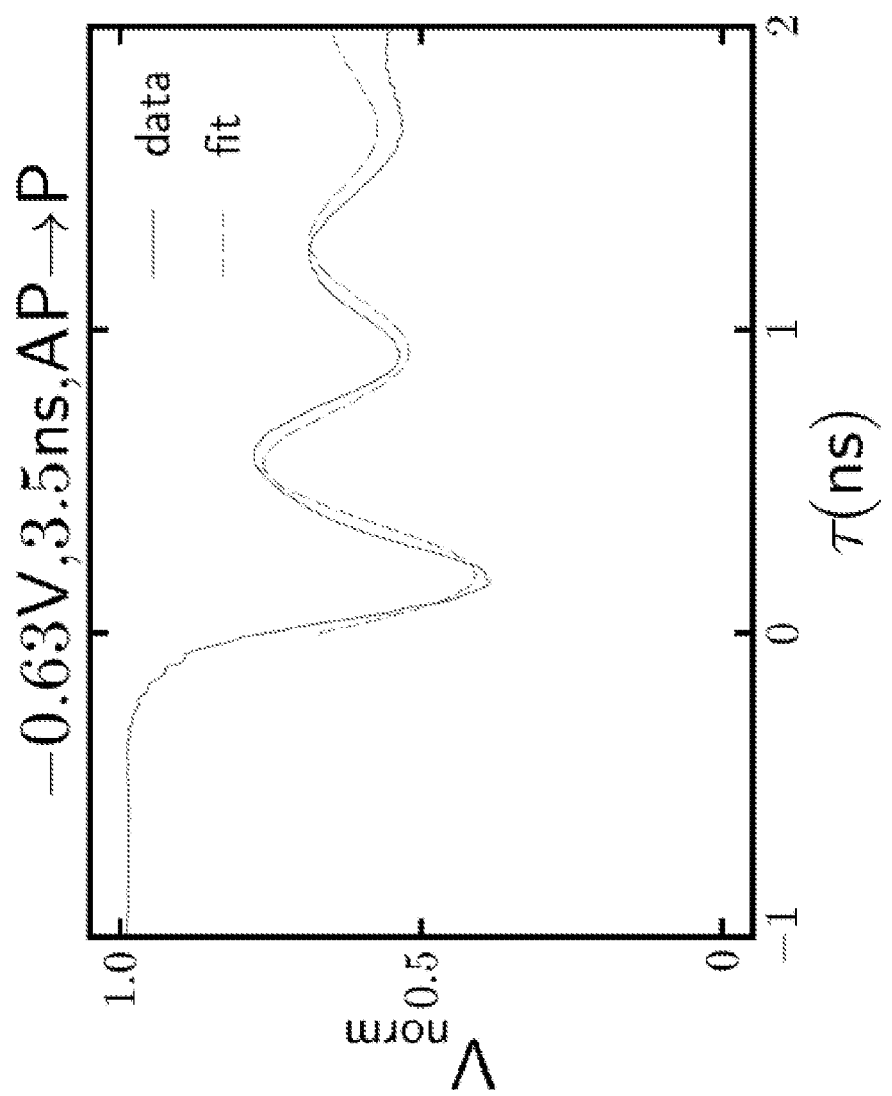
FIG. 19 shows an oscillating curve of AP to P switching for −0.63 V, 3.5 ns pulses together with a fit to an equation in accordance with an illustrative implementation.

FIG. 19 shows the oscillating curve of AP to P switching for −0.63 V, 3.5 ns pulses together with a fit to the equation above. The data and fit agree reasonably well. The angular frequency can then be obtained of $\omega=8.5 \times 10^9$ rad/s, corresponding to a demagnetization field of 48 mT. Since it is known that $\mu_0 M$, is at the order of 1 T, this demagnetization field corresponds to a tilt angle of only a few degrees. This is not a surprise since the pulse amplitude is just large enough to induce precessional switching.

One item worth noting is that the values of the voltage oscillation amplitude do not provide direct information of the amplitude of the magnetization oscillations because P and the AP curves, i.e. 0 and 1 in this normalized scale, are obtained from averaging pulse traces with a large applied magnetic field (−40 mT for the P state and 40 mT for the AP state; recall that the room temperature coercive field is only 6 mT) for the same pulse configuration. Therefore, the device is know for sure to stay in the P or the AP state. However, the magnetization configuration of such P and AP states may be different than that of the P and AP states with zero applied field, as in the case of the pulse measurements. There are some resistance differences between these P and AP states from hysteresis measurements as well. Also the oscillating curves are obtained from averaging over more than 10,000 events with random thermal noise and the thermal noise could provide a faster reduction to the oscillation amplitude than an exponential decrease.

Figure 20:
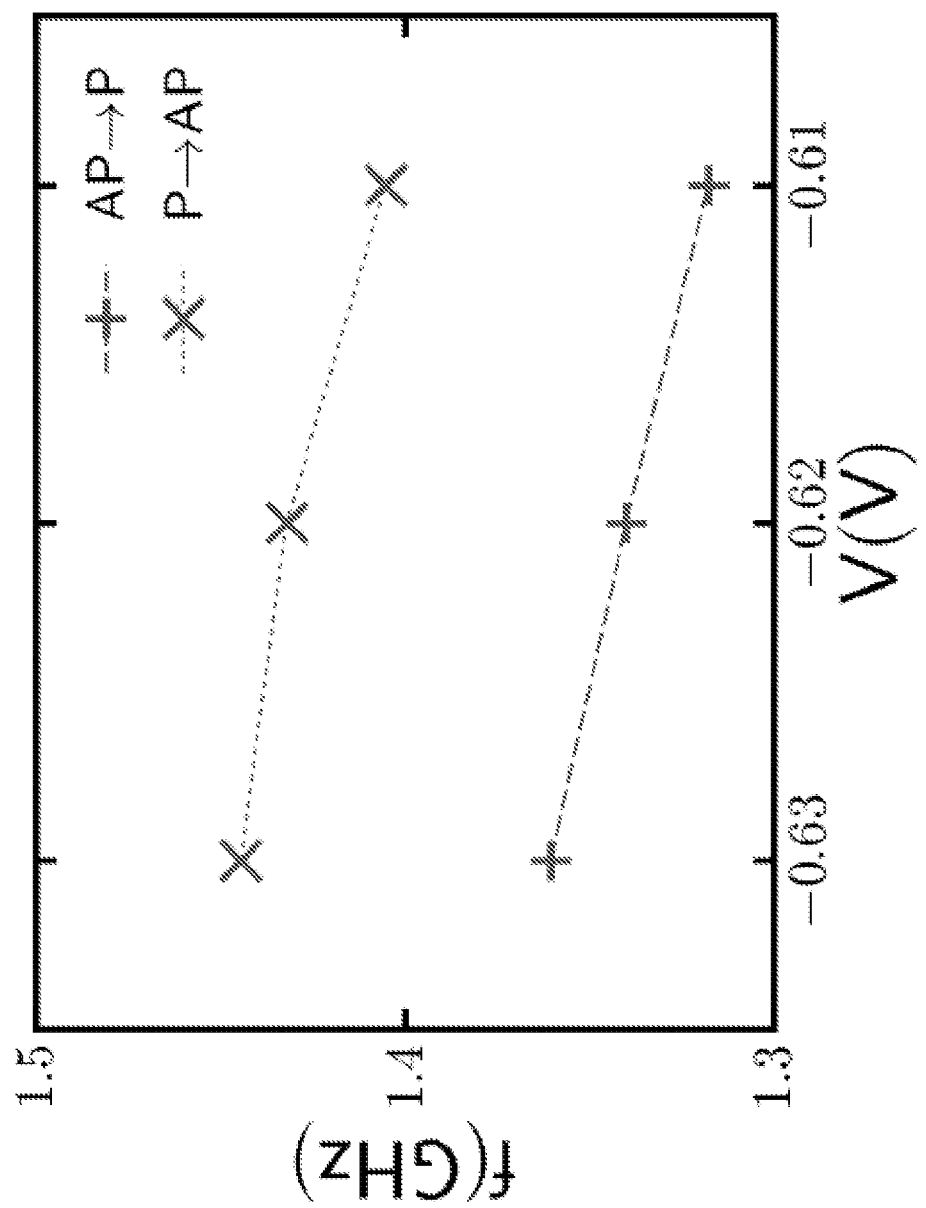
FIG. 20 shows the frequency of the precession as a function of pulse amplitude for both AP to P switching and P to AP switching in accordance with an illustrative implementation.

The frequency of the precession can be obtained for all the pulse amplitudes shown in FIGS. 18A and 18B. FIG. 20 shows the frequency of the precession as a function of the pulse voltages for both AP to P switching and P to AP switching. The frequency increases as the absolute value of the pulse amplitude increases, in line with a larger current creates a larger tilting angle for the free layer.

Based upon the above, the voltage dependence of the tilting angle in this small-tilting angle and linear response regime can be estimated. FIG. 20 yields a linear slope of −2 GHz/V, which corresponds to a 70 mT increase in the demagnetization field when the pulse voltage increases 1V. Assuming that the saturation magnetization of the device is around 1 T, then a 1 V increase in pulse voltage only leads to 4° increase in the tilting angle.

As described above, orthogonal spin transfer MRAM devices can be fabricated that incorporate a magnetic tunnel junction. In various implementations, 100% switching probability is reached for pulses shorter than 500 ps requiring an energy less than 450 fJ. Due to the perpendicular polarizer, switching is possible for both pulse polarities. Indications of the precessional switching has been observed in statistical pulse measurements from the non-monotonic behavior of the switching probability versus pulse amplitude. Time-resolved measurements were used to study the magnetization dynamics in orthogonal spin transfer MRAM devices. The P and AP states and the transition between these two states were identified during the pulse from single-shot signal traces. For over 10,000 switching events for both AP to P and P to AP switching, the main switching processes are quite distinct, even for the same pulse parameters. For AP to P switching, the device typically makes a direct transition within 200 ps. For P to AP switching, the reversal is precessional. One explanation for the different switching processes is based on the strength of the out-of-plane torque, which depends on the pulse current through the device and is initially larger for a device starting in the P state than one starting in the AP state. With an increasing pulse amplitude, and therefore the strength of the out-of-plane torque, precessional reversal can be observed for both AP to P and P to AP switching. The frequency of the precession indicates a small tilting angle precession. These results demonstrates the strong influence of the spin torques acting perpendicular to the plane of the free layer on the switching processes and provides new possibilities to control and optimize device operation.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Moreover, the separation of various system components in the implementations described above should not be understood as requiring such separation in all implementations, and it should be understood that the described program components and systems can generally be integrated in a single software product or packaged into multiple software products.

Similarly, while operations are depicted in the drawings in a particular order, this should not be understood as requiring that such operations be performed in the particular order shown or in sequential order, or that all illustrated operations be performed, to achieve desirable results. Thus, particular implementations of the subject matter have been described. Other implementations are within the scope of the following claims.

What is claimed is:

1. A magnetic device, comprising:
    a polarizing layer configured to provide a first spin-torque, wherein the polarizing layer is magnetized perpendicular to a free layer;
    a free layer having a magnetization vector having at least a first stable state and a second stable state, wherein the free layer is magnetized parallel to a plane of the free layer;
    a reference layer configured to provide a second spin-torque, wherein the first spin-torque and the second spin-torque combine, wherein the combined first spin-torque and second spin-torque influences the magnetic state of the free layer, wherein application of a first voltage pulse, having either positive or negative polarity and a selected amplitude and duration, through the magnetic device causes the magnetization vector to oscillate between the first stable state and the second stable state for a portion of the duration regardless of an initial state of the magnetization vector; and
    a magnetic tunnel junction formed by the free layer and the reference layer.

2. The magnetic device of claim 1, wherein the duration is greater than 2 ns.

3. The magnetic device of claim 2, wherein the amplitude of the first voltage pulse is greater than 0.60 V.

4. The magnetic device of claim 1, wherein a change between states during the oscillation is precessional.

5. The magnetic device of claim 4, wherein the first voltage pulse is configured to increase a strength of the first spin-torque, and wherein the change between states being precessional is based at least in part on the strength of the first spin-torque.

6. The magnetic device of claim 1, wherein the first stable state corresponds to a state in which the magnetization of the free magnetic layer is largely parallel to the magnetization state of the reference layer.

7. The magnetic device of claim 6, wherein the second stable state corresponds to an largely antiparallel state of the magnetizations of the free and reference magnetic layers.

8. The magnetic device of claim 1, wherein the first stable state and the second stable state indicate a value of a bit.

9. The magnetic device of claim 1, wherein the magnetic device is an oscillator that operates at a frequency of the oscillation, and wherein the frequency of the oscillation is based upon the precessional switching between the first stable state and the second stable state.

10. The magnetic device of claim 1, wherein the application of the first voltage pulse causes the magnetization vector, having an initial state, to switch to a different ending state, wherein an applicant of a second voltage pulse having a same polarity as the first voltage pulse causes the magnetization vector to switch from the end state back to the initial state.

11. A system comprising:
    a magnetic device comprising:
        a polarizing layer configured to provide a first spin-torque, wherein the polarizing layer is magnetized perpendicular to a free layer;
        a free layer having a magnetization vector having at least a first stable state and a second stable state, wherein the free layer is magnetized parallel to a plane of the free layer;
        a reference layer configured to provide a second spin-torque, wherein the first spin-torque and the second spin-torque combine, wherein the combined first spin-torque and second spin-torque influences the magnetic state of the free layer, wherein application of a first voltage pulse, having either positive or negative polarity and a selected amplitude and duration, through the magnetic device causes the magnetization vector to oscillate between the first stable state and the second stable state for a portion of the duration regardless of an initial state of the magnetization vector; and
    a magnetic tunnel junction formed by the free layer and the reference layer.

12. The system of claim 11, wherein the duration is greater than 2 ns.

13. The system of claim 12, wherein the amplitude of the first voltage pulse is greater than 0.60 V.

14. The system of claim 11, wherein a change between states during the oscillation is precessional.

15. The system of claim 14, wherein the first voltage pulse is configured to increase a strength of the first spin-torque, and wherein the change between states being precessional is based at least in part on the strength of the first spin-torque.

16. The system of claim 11, wherein the first stable state corresponds to a state in which the magnetization of the free magnetic layer is largely parallel to the magnetization state of the reference layer.

17. The system of claim 16, wherein the second stable state corresponds to an largely antiparallel state of the magnetizations of the free and reference magnetic layers.

18. The system of claim 11, wherein the first stable state and the second stable state indicate a value of a bit.

19. The system of claim 11, wherein the magnetic device is an oscillator that operates at a frequency of the oscillation, and wherein the frequency of the oscillation is based upon the precessional switching between the first stable state and the second stable state.

20. The system of claim 11, wherein the application of the first voltage pulse causes the magnetization vector, having an initial state, to switch to a different ending state, wherein an applicant of a second voltage pulse having a same polarity as the first voltage pulse causes the magnetization vector to switch from the end state back to the initial state.

* * * * *